United States Patent
Wohl et al.

(10) Patent No.: US 7,823,034 B2
(45) Date of Patent: Oct. 26, 2010

(54) PIPELINE OF ADDITIONAL STORAGE ELEMENTS TO SHIFT INPUT/OUTPUT DATA OF COMBINATIONAL SCAN COMPRESSION CIRCUIT

(75) Inventors: Peter Wohl, Williston, VT (US); John A Waicukauski, Tualatin, OR (US); Frederic J Neuveux, Meylan (FR)

(73) Assignee: Synopsys, Inc., Mountain View, CA (US)

( * ) Notice: Subject to any disclaimer, the term of this patent is extended or adjusted under 35 U.S.C. 154(b) by 711 days.

(21) Appl. No.: 11/786,968

(22) Filed: Apr. 13, 2007

(65) Prior Publication Data

US 2008/0256274 A1    Oct. 16, 2008

(51) Int. Cl.
*G01R 31/28* (2006.01)
*G06F 17/50* (2006.01)

(52) U.S. Cl. .............. 714/726; 714/729; 714/733; 714/741; 714/742; 716/4

(58) Field of Classification Search ............... 714/726, 714/729, 733, 741, 742; 716/4
See application file for complete search history.

(56) References Cited

U.S. PATENT DOCUMENTS

| | | | |
|---|---|---|---|
| 6,114,892 A * | 9/2000 | Jin ........................... | 327/202 |
| 6,611,933 B1 * | 8/2003 | Koenemann et al. ....... | 714/726 |
| 6,684,358 B1 * | 1/2004 | Rajski et al. ................ | 714/739 |
| 7,038,494 B2 * | 5/2006 | Morton ....................... | 326/93 |
| 7,159,161 B2 * | 1/2007 | Lee et al. .................... | 714/738 |
| 7,395,473 B2 * | 7/2008 | Cheng et al. ............... | 714/729 |
| 7,590,905 B2 * | 9/2009 | Abdel-Hafez et al. ...... | 714/726 |
| 2003/0171906 A1 * | 9/2003 | Parulkar et al. .............. | 703/14 |
| 2005/0268190 A1 * | 12/2005 | Kapur et al. ................ | 714/726 |
| 2006/0064614 A1 * | 3/2006 | Abdel-Hafez et al. ...... | 714/726 |
| 2006/0156144 A1 * | 7/2006 | Cheng et al. ................ | 714/742 |
| 2008/0133987 A1 * | 6/2008 | Rajski et al. ................ | 714/719 |
| 2008/0256497 A1 * | 10/2008 | Wohl et al. .................... | 716/3 |
| 2008/0294953 A1 * | 11/2008 | Cheng et al. ................ | 714/726 |

OTHER PUBLICATIONS

Pateras, Achieving At-Speed Structural Test, Sep. 15, 2003, IEEE, vol. 20, pp. 26-33.*

(Continued)

*Primary Examiner*—John J Tabone, Jr.
(74) *Attorney, Agent, or Firm*—Bever, Hoffman & Harms, LLP; Jeanette S. Harms

(57) ABSTRACT

An electronic device includes a scan-based circuit that includes a combinational decompressor, a combinational compressor, scan chains, and logic which typically includes a number of storage elements. Cycle time normally needed to shift data into or out of a scan cell to/from an external interface of the electronic device is reduced by use of one or more additional storage element(s) located between the external interface and one of the combinational elements (decompressor/compressor). The one or more additional storage element(s) form a pipeline that shifts compressed data in stages, across small portions of an otherwise long path between the external interface and one of the combinational elements. Staged shifting causes the limit on cycle time to drop to the longest time required to traverse a stage of the pipeline. The reduced cycle time in turn enables a corresponding increase in shift frequency.

15 Claims, 21 Drawing Sheets

OTHER PUBLICATIONS

G. Hetherington, T. Fryars, N. Tamarapalli, M. Kassab, A. Hassan, J. Rajski, "Logic BIST for Large Industrial Designs: Real Issues and Case Studies", *International Test Conference* 1999, pp. 358-367.

C. Barnhart, V. Brunkhorst, F. Distler, O. Farnsworth, B. Keller, B. Koenemann, "OPMISR: The Foundation for Compressed ATPG Vectors", *International Test Conference* 2001.

D.M. Wu, M. Lin, S. Mitra, K.S. Kim, A. Sabbavarapu, T. Jaber, P. Johnson, D. March, G. Parrish, "H-DFT: A Hybrid DFT Architecture for Low-Cost High-Quality Structural Testing", *International Test Conference* 2003.

\* cited by examiner

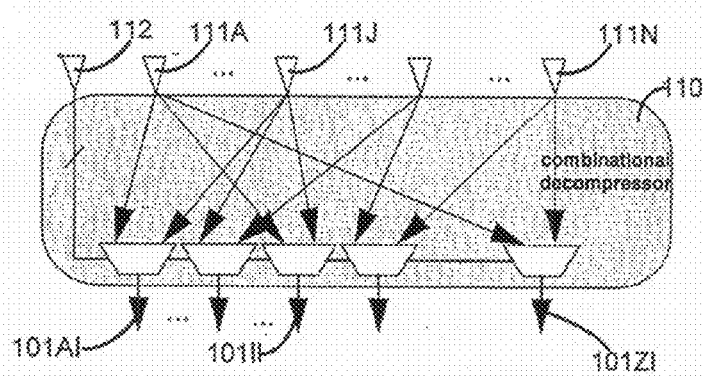
FIG. 1C (prior art)
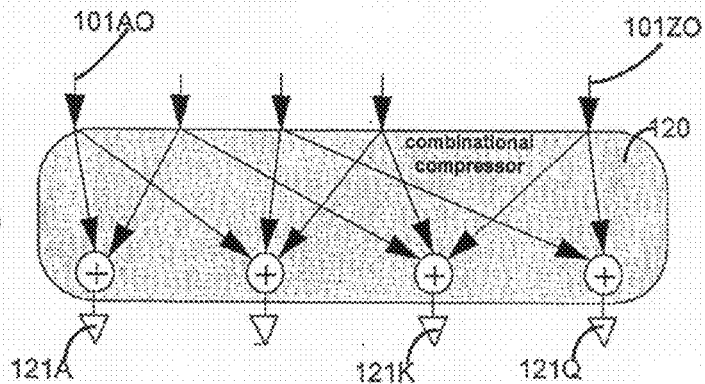
FIG. 1D (prior art)
FIG. 1E (prior art)
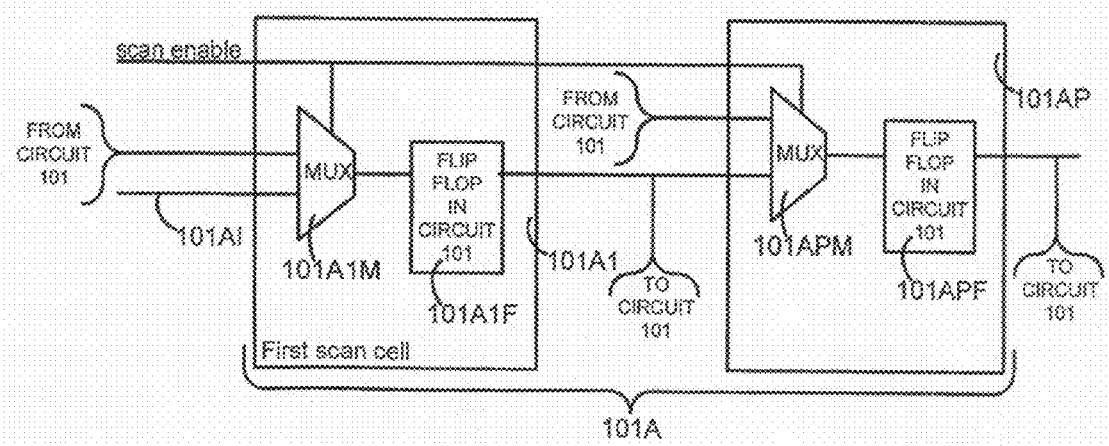

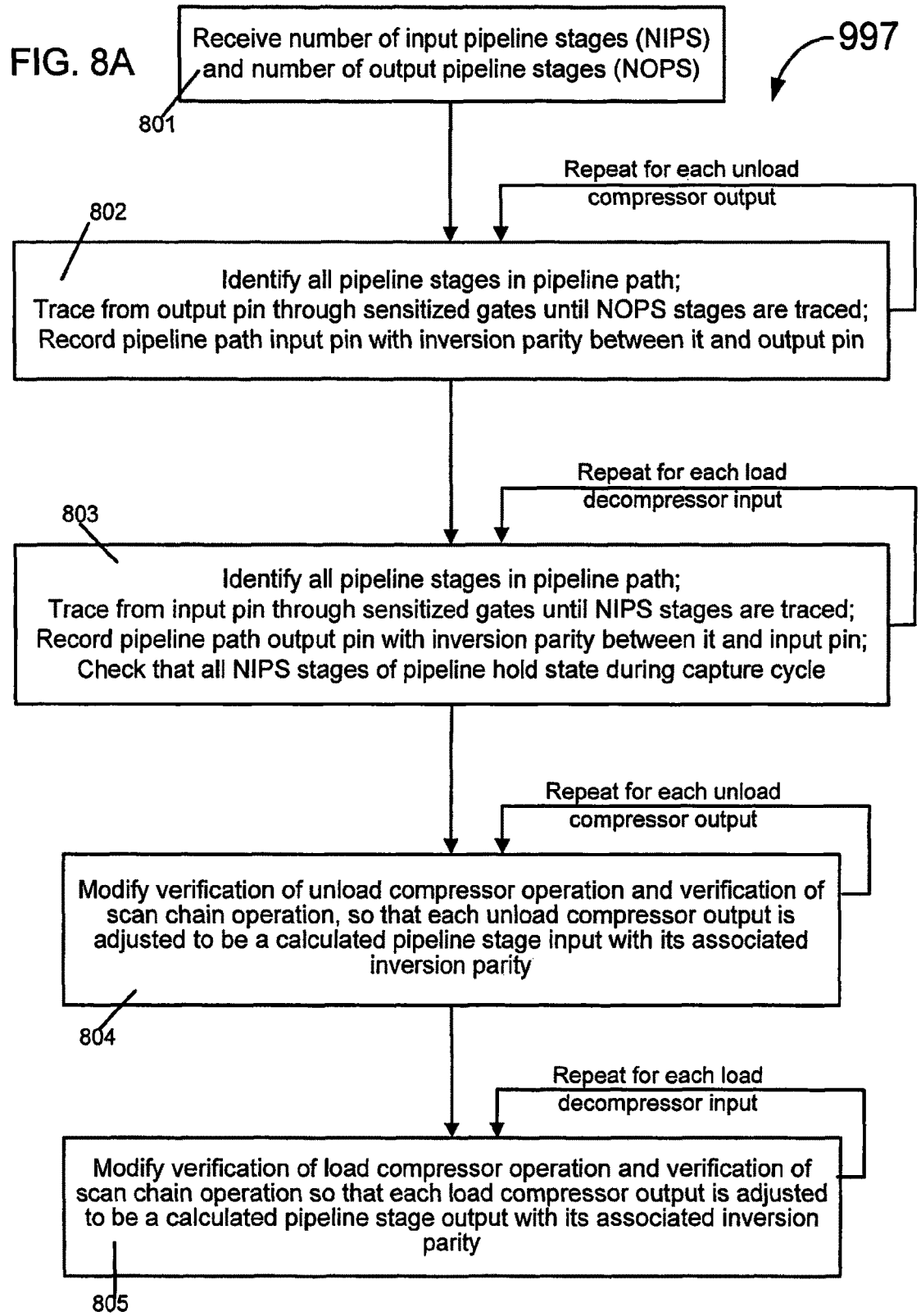

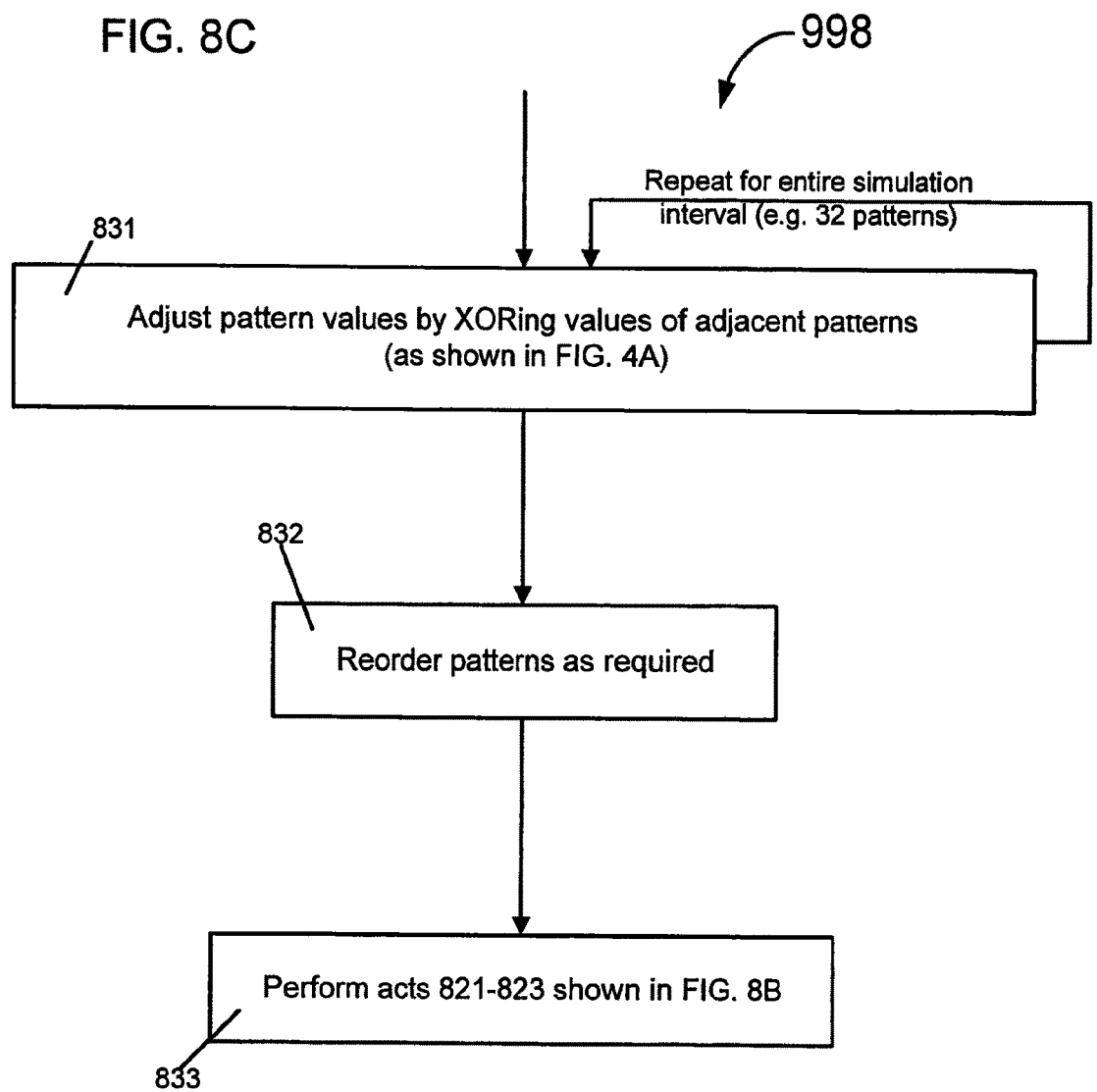

| input | usage | 0 | 1 | 2 | 3 | 4 |
|---|---|---|---|---|---|---|
| 0 | 2 | | 1 | 1 | 1 | 1 |
| 1 | 1 | 1 | | 1 | 0 | 0 |
| 2 | 1 | 1 | 1 | | 0 | 0 |
| 3 | 1 | | 1 | 0 | 0 | 1 |
| 4 | 1 | | 1 | 0 | 0 | 1 | after modes 0, 1

| input | usage | 0 | 1 | 2 | 3 | 4 |
|---|---|---|---|---|---|---|
| 0 | 2 | | 1 | 1 | 1 | 1 |
| 1 | 2 | 1 | | 3 | 1 | 0 |
| 2 | 2 | 1 | 3 | | 1 | 0 |
| 3 | 2 | 1 | 1 | 1 | | 1 |
| 4 | 1 | | 1 | 0 | 0 | 1 | final (after modes 0, 1, 2)

| unload control | mode: | 0 | 1 | 2 |
|---|---|---|---|---|
| 0 | | 0 | 3 | 1 |
| 1 | | 1 | 4 | 3 |
| 2 | | 2 | 0 | 2 |

PIPELINE OF ADDITIONAL STORAGE ELEMENTS TO SHIFT INPUT/OUTPUT DATA OF COMBINATIONAL SCAN COMPRESSION CIRCUIT

BACKGROUND

1. Field of the Invention

The invention relates to an architecture for a scan-based integrated circuit (IC). More specifically, the invention relates to a method and circuitry to reduce cycle time in shifting data between an external interface and through a combinational decompressor and/or compressor of a combinational scan compression circuit.

2. Related Art

FIG. 1A illustrates a flow 10 of prior art, for processing a scan test pattern. In flow 10, step 11 sets up the scan chain configuration using flip-flops in the design, thereby identifying the scan cells of the scan chain. Step 12 shifts the scan-in values into the active scan chains. Step 13 exits the scan configuration. Step 14 applies stimulus to the inputs of the logic to be tested (such as logic 101 in FIG. 1B), and measures the outputs. Step 15 pulses the clocks to capture the logic's response in the flip-flops. Step 16 sets up the scan chain configuration. Step 17 shifts the scan-out values from the active scan chains. Step 18 exits the scan configuration.

For clarification of various steps discussed above, FIG. 1B illustrates a prior art electronic device which includes a circuit 100 that implements combinational scan compression (CSC). Accordingly, CSC circuit 100 includes a combinational decompressor 110, a combinational compressor 120, and a number of scan chains 101A-101Z coupled between combinational decompressor 110 and combinational compressor 120. Combinational decompressor 110 typically includes a number of multiplexers as shown in FIG. 1C (or exclusive OR gates). Similarly, combinational compressor 120 typically includes a number of exclusive OR gates as illustrated in FIG. 1D.

Referring back to FIG. 1B, CSC circuit 100 also includes a logic 101 to implement various features of functionality to be performed by the electronic device. Logic 101 typically includes a number of flip-flops that are required to implement the functionality. A subset of these same flip-flops are used, with multiplexers, to form scan cells that are organized into scan chains of the type shown in FIG. 1B. Specifically, flip-flops 101A1F and 101APF illustrated in FIG. 1E are portions of logic 101 that are made accessible via an external interface formed by input terminals 111A-111N, 112 and output terminals 121A-121Q of the electronic device, by use of multiplexers 101A1M and 101APM. Each corresponding pair, constituting a multiplexer driving a flip flop, forms a scan cell as shown in FIG. 1E.

Note that the primary input terminals 102PI and the primary output terminals 102PO of the logic 101 are physically identical to above-described input terminals 111A-111N, 112 and output terminals 121A-121Q of the external interface, but are shown separately in FIG. 1B to clearly show a distinction between scan mode operation and normal functional operation of CSC circuit 100. The difference between the two modes of operation is identified to CSC circuit 100 from an external source, via a scan enable signal on input terminal 112.

In FIG. 1A's step 11 multiplexers 101A1M and 101APM are added between logic 101 and flip-flops 123. Using a scan_enable (i.e. a control) signal, multiplexers 101A1M and 101APM can be configured to allow scan-in values to be shifted into flip-flops 101A1F and 101APF without going through logic 101 in step 102. In step 103, multiplexers 101A1M and 101APM can be reconfigured to accept values from logic 101. At this point, stimulus can be applied to CSC circuit 100 in step 104. A pulse can be applied to the clock CLK terminals of flip-flops 101A1F and 101APF to capture the resulting values in step 105. In step 106, multiplexers 101A1M and 101APM can be reconfigured to shift those resulting values out through the scan chain comprising flip-flops 123. Step 108 marks the end of processing a single scan test pattern.

The inventors of the current patent application note that the time required for a signal to propagate from an input terminal 111A to first scan cell 101A1F, through combinational decompressor 110 can be significant. This time along path 191, can easily impose a limit on the speed at which input data can be shifted into CSC circuit 100, if the delay between adjacent flip-flops in a scan chain is small. A similar delay limits the speed at which output data can be shifted from CSC circuit 100 along path 192 to an output terminal 121A. The inventors further note that scan chains 101A-101Z in CSC circuit 100 (FIG. 1B) are typically located far apart from terminals in external interface 111A-111N, 112 and 121A-121Q, relative to the distance between adjacent scan cells of any scan chain. Such distant location of scan chains from the external interface results in long wires and large wire delays in prior art circuits. Hence, the inventors believe that there is a need to overcome such large wire delays.

SUMMARY

In accordance with the invention, an electronic device is designed to reduce cycle time normally required to shift compressed data between an external interface and a combinational element (compressor/decompressor) of a combinational scan compression (CSC) circuit, by use of one or more storage element(s) that are newly added, in addition to any circuit elements already present in the CSC circuit. Accordingly, one or more storage element(s) that are added in a route (or path), between an external interface and a scan chain, form a pipeline in accordance with the invention that shifts compressed data in stages, across small portions of the route or path. Staged shifting across individual portions as just described can reduce cycle time, e.g. cycle time in some embodiments can be made no more than the longest time required to traverse a stage of the pipeline (that is newly added), if time for data transfer between adjacent scan cells is smaller. The reduced cycle time in turn enables a corresponding increase in frequency at which the compressed data can be shifted through scan chains in the electronic device.

BRIEF DESCRIPTION OF THE DRAWINGS

FIGS. 1C-1E illustrate prior art components within the electronic device of FIG. 1B.

FIGS. 8A-8C illustrate, in flow charts, acts performed by tools to support ATPG, by adjusting values of load and unload patterns.

FIG. 11 illustrates an architecture of an unload compressor, as described in SECTION B below.

DETAILED DESCRIPTION

Figure 1A:
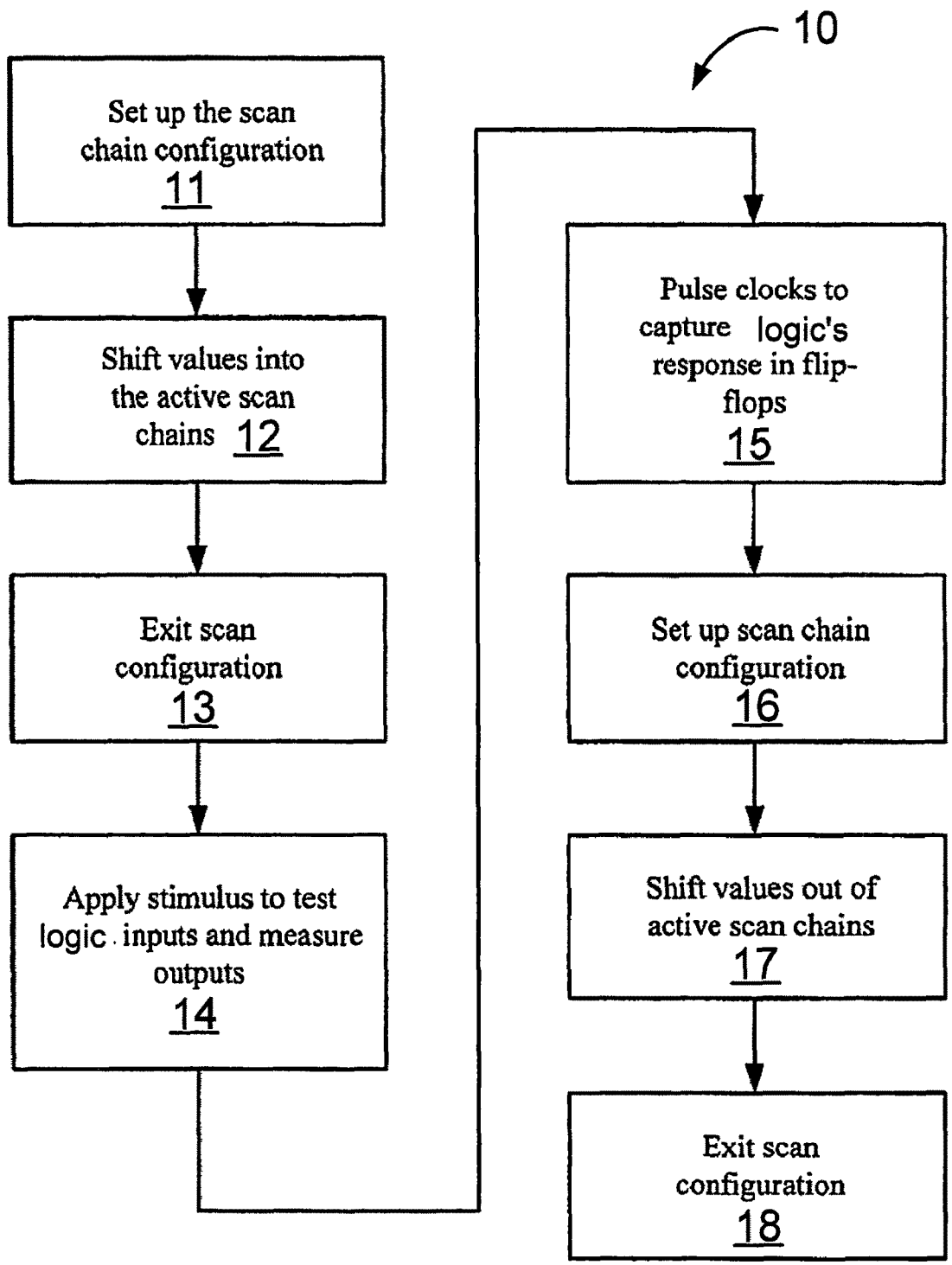
FIG. 1A illustrates a prior art flow for processing a scan test pattern.
Figure 1B:
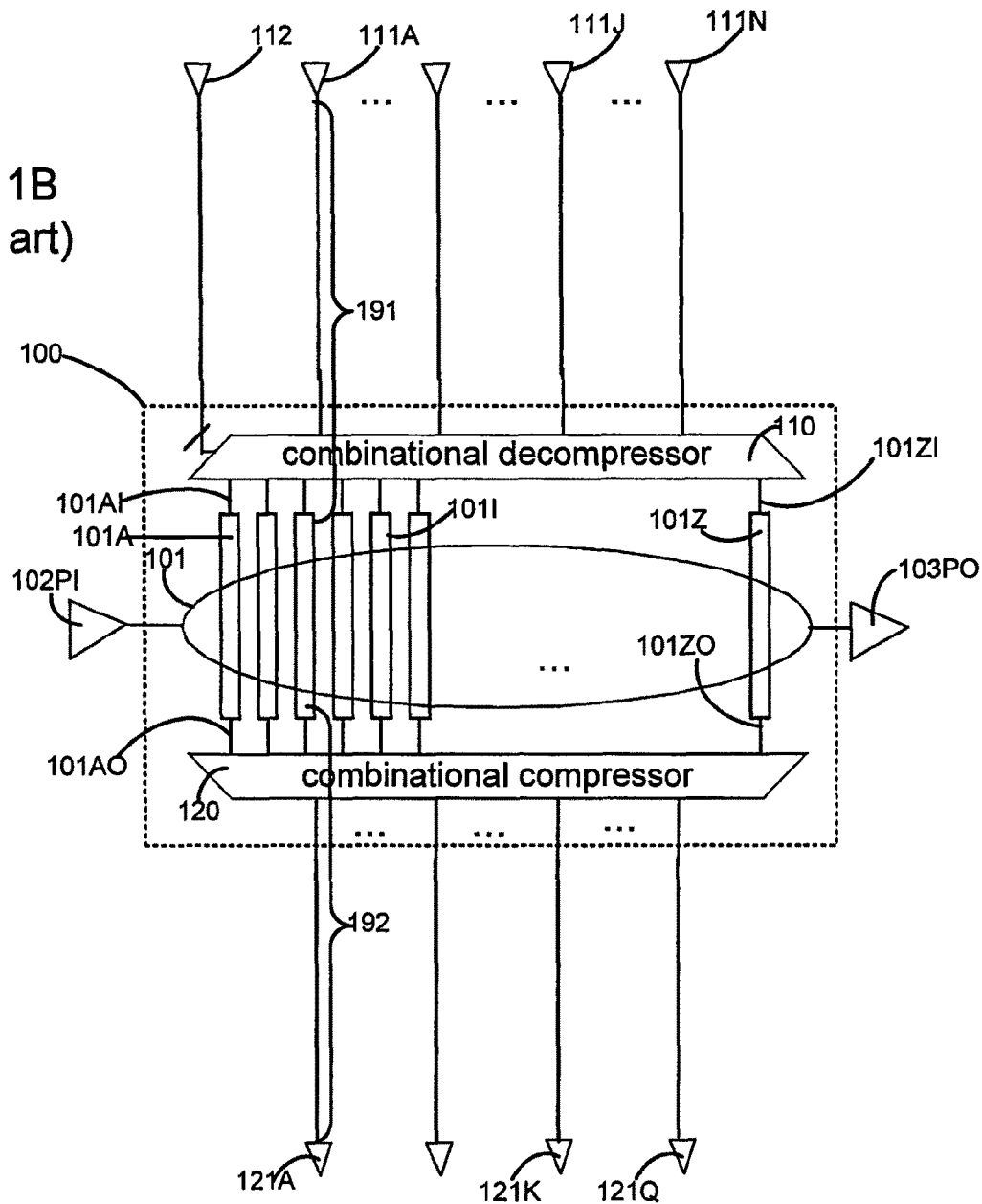
FIG. 1B illustrates an electronic device of the prior art, including a CSC circuit 100.
Figure 2A:
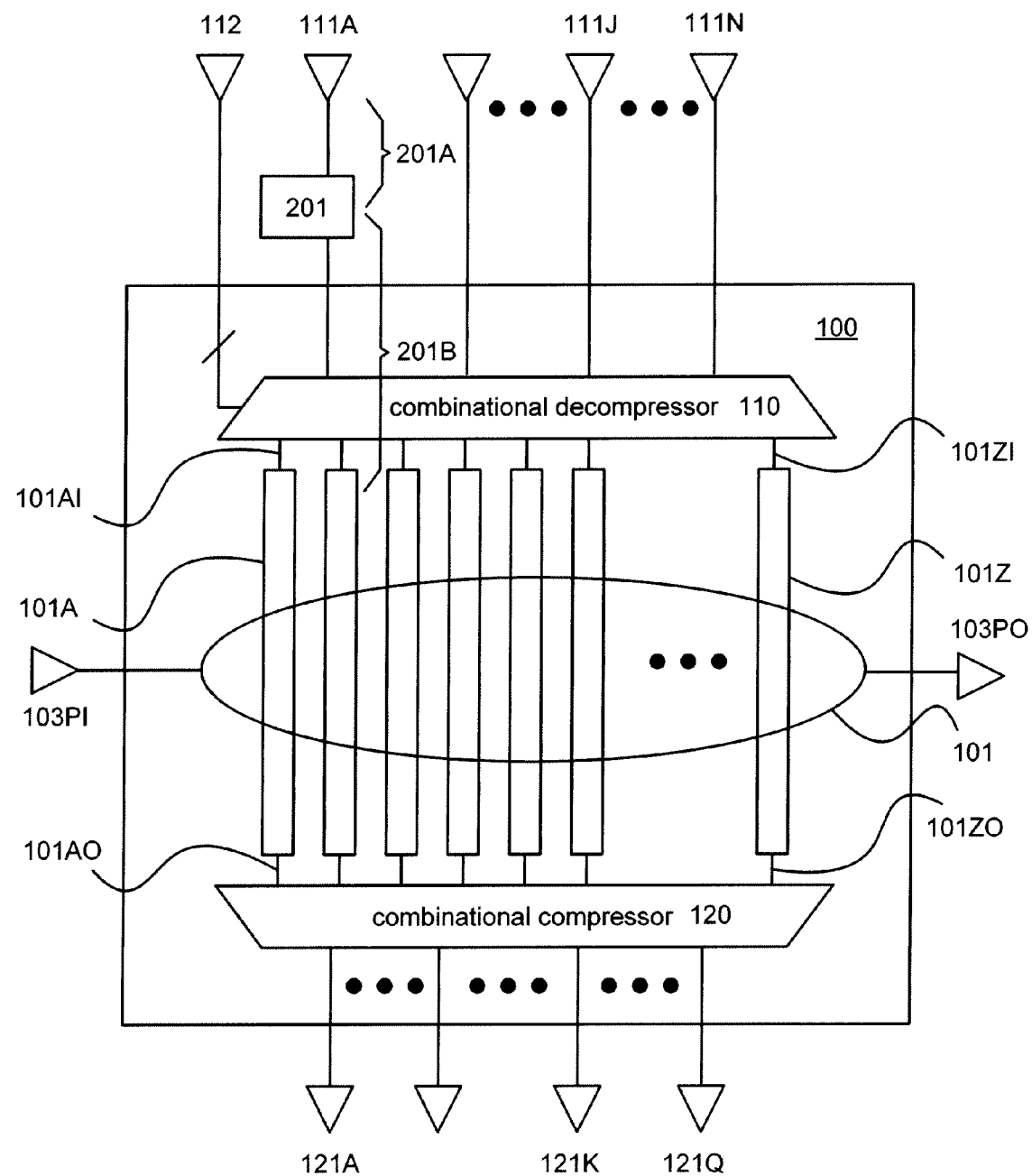
FIG. 2A illustrates, in a high-level block diagram, one embodiment of the invention that uses an additional storage element to reduce cycle time to transfer compressed data from input terminal 111J to CSC circuit 100.

Cycle time that is normally required to shift compressed data in an ingress path 191 (FIG. 1B) from an input terminal 111A to a first scan cell in a combinational scan compression (CSC) circuit 100, is reduced in one embodiment of the invention as follows. Ingress path 191 (FIG. 1B) is split into two portions thereof, by addition of a storage element 201 that is clocked, as shown in FIG. 2A. In this embodiment, CSC circuit 100 has been kept unchanged during addition of element 201 (and for this reason it is shown hatched in FIG. 2A). Accordingly, storage element 201 is not from within circuit 100.

More specifically, storage element 201 does not implement any of the features of functionality to be performed by the electronic device. Instead, in the example illustrated in FIG. 2A, storage element 201 is newly added, and is directly connected to a terminal 111A of the external interface, without any combinational element or storage element therebetween. This storage element 201 is also referred to below as an "additional" storage element 201. In accordance with the invention, additional storage element 201 is used primarily to temporarily store an ingress signal, to enable the ingress signal's traversal of prior path 191 (FIG. 1B) to be made in two successive cycles along the two portions 201A and 201B (FIG. 2A).

Even if a physical distance along prior path 191 is unchanged by addition of storage element 201, the data applied to terminal 111J travels in two cycles as noted above. Accordingly, with storage element 201 present, cycle time for shifting input data is no longer limited by the duration required for a signal to travel the entire prior path 191. For example, if storage element 201 is placed half-way within prior path 191, and if two portions 201A and 201B that are newly created are equal, then cycle time may now be constrained by half the previous limit i.e. half the time required to travel the total distance of path 191.

Figure 2B:
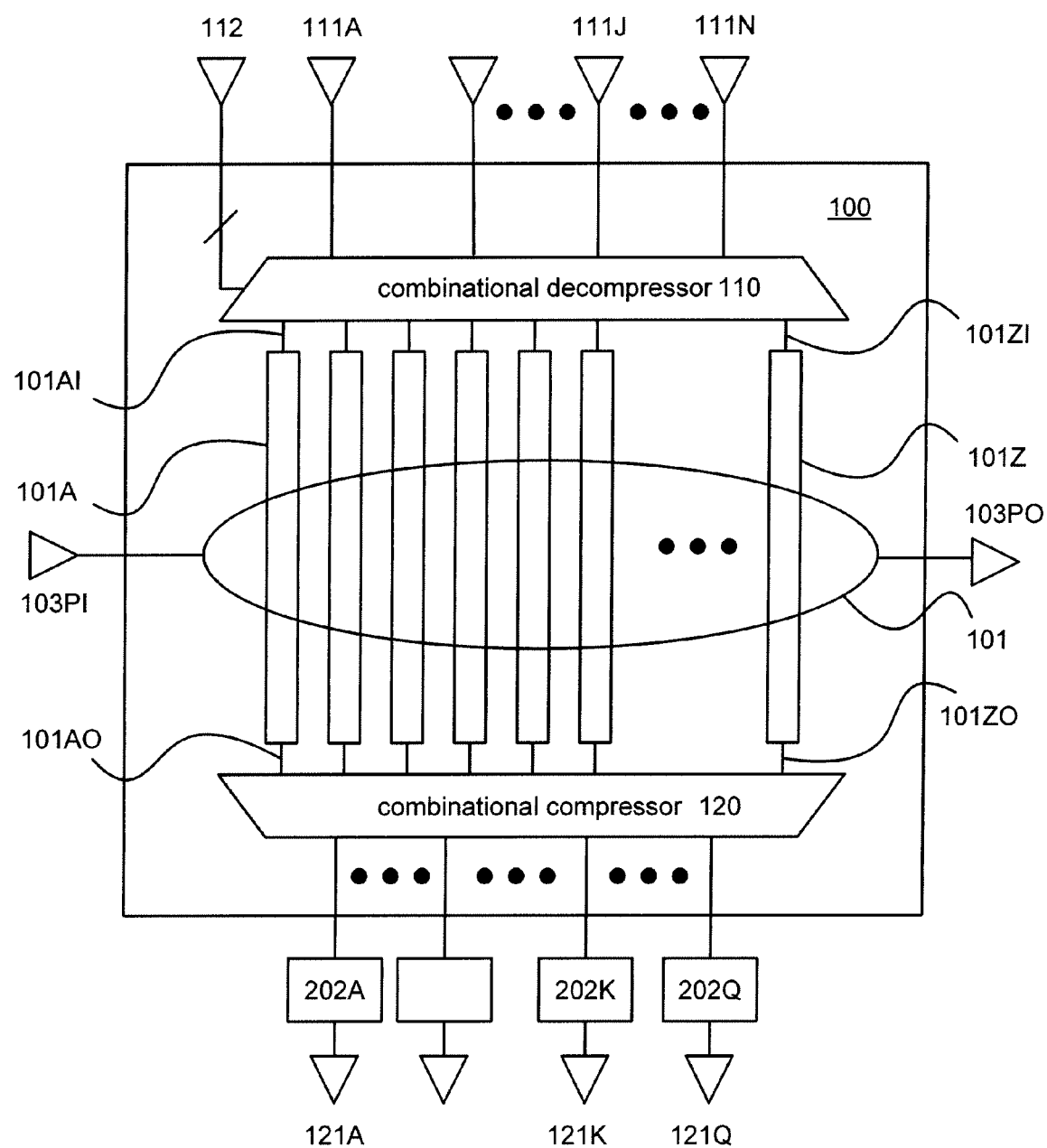
FIG. 2B illustrates, in a high-level block diagram, another embodiment of the invention that uses an additional storage element to reduce cycle time to transfer compressed data from CSC circuit 100 to output terminal 121K.

Although one illustrative embodiment shown in FIG. 2A uses a single storage element to reduce the delay in shifting input data on a single path, other embodiments in accordance with the invention can use any number of such storage elements to reduce cycle time along any number of paths. For example, FIG. 2B illustrates use of a storage element in a similar manner as FIG. 2A, to reduce cycle time in shifting output data from scan chains. Note that a limit on cycle time imposed by all output paths, i.e. from a last scan cell in a scan chain in CSC circuit 100 to a corresponding one of output terminals 121A-121Q can be reduced, by insertion of a storage element (e.g. storage element 202K), to break up each egress path from compressor 120 into two portions. Also, note once again, no change has been made, in this illustrative example as well, to any circuit elements and/or interconnections that are inside CSC circuit 100 (which is again shown unchanged, by hatching).

Figure 2C:
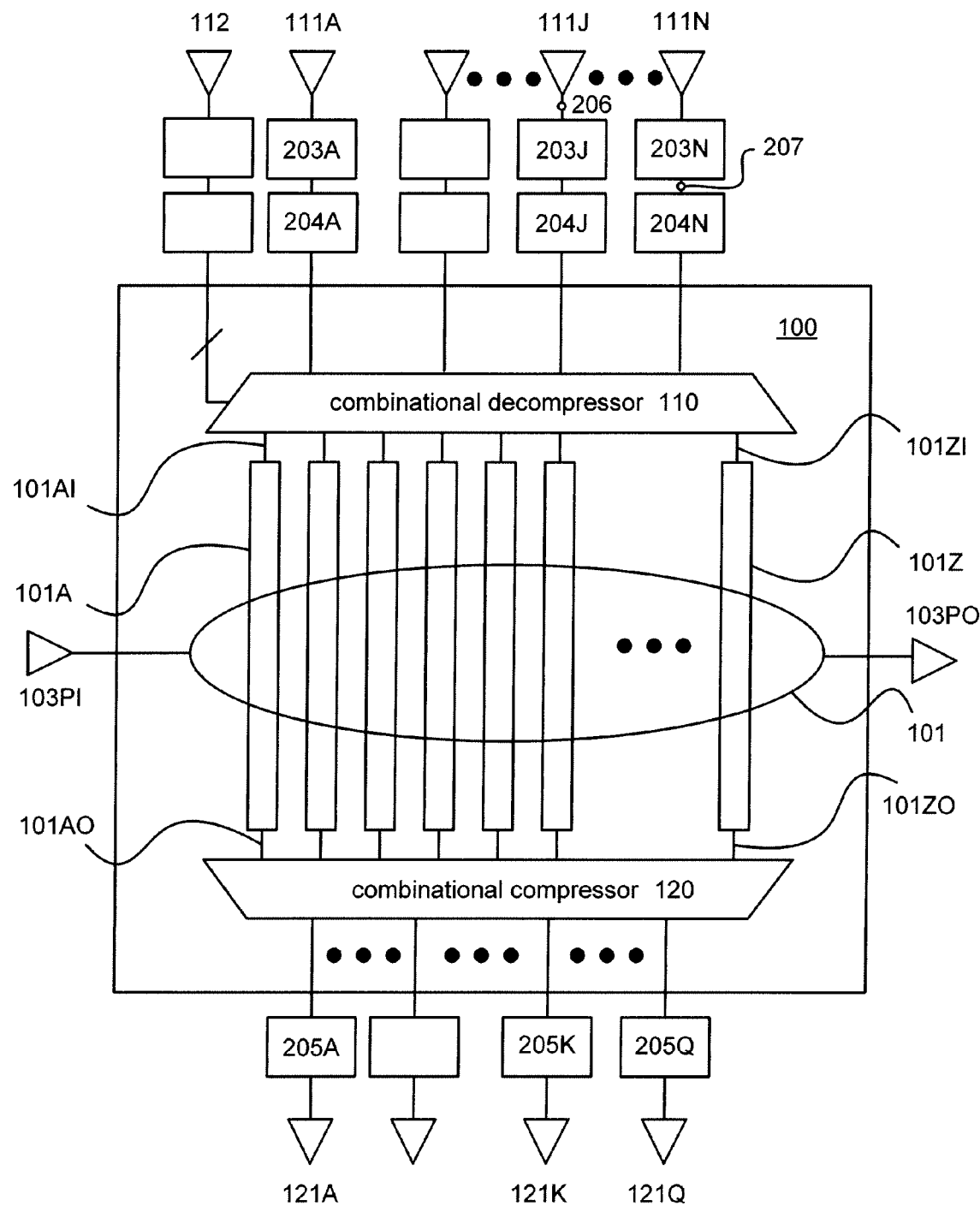
FIG. 2C illustrates, in a high-level block diagram, yet another embodiment of the invention that uses several additional storage elements to reduce cycle time to transfer compressed data between CSC circuit 100 and terminals 111A-111N and 121A-121Q.
Figure 9A:
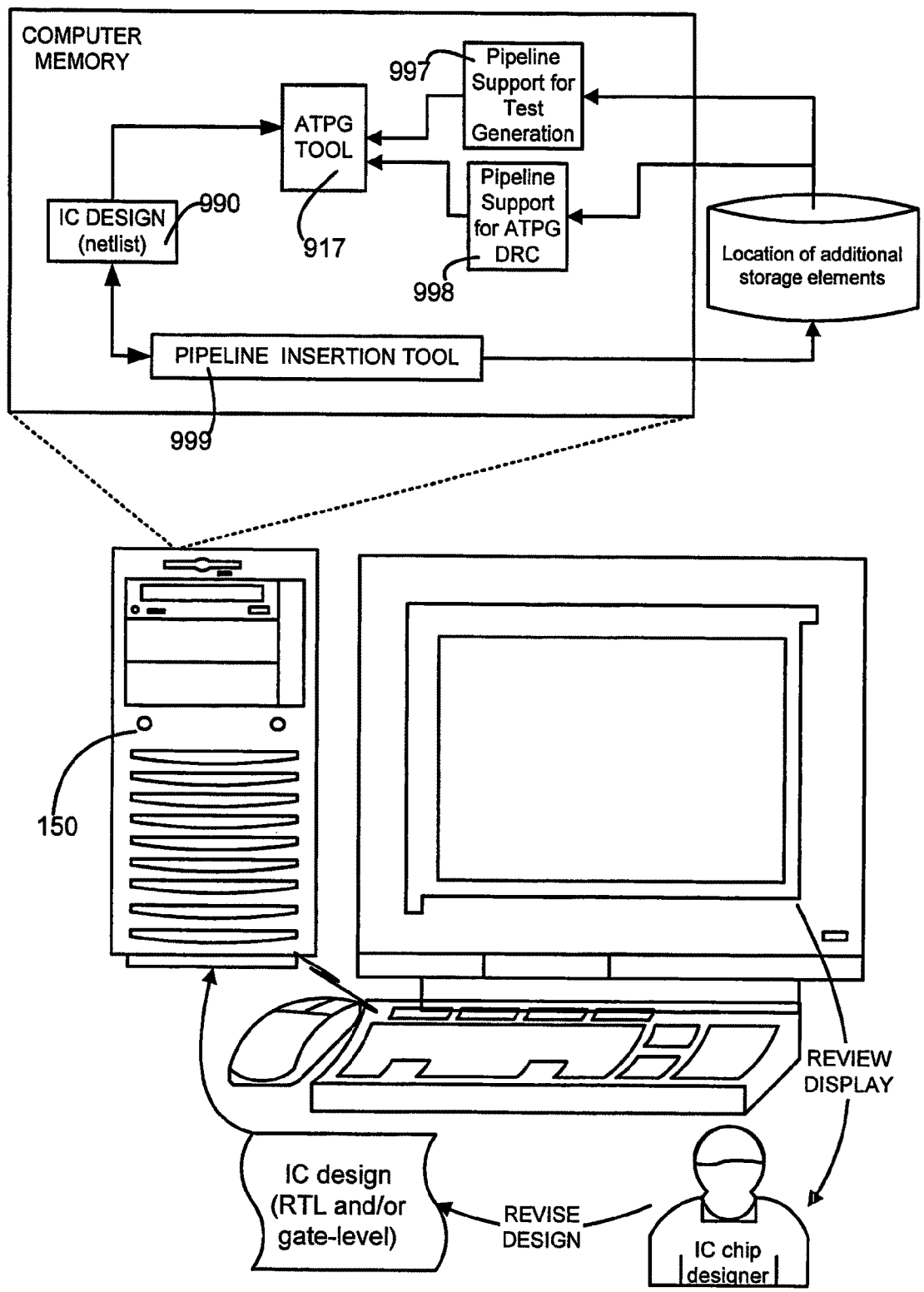
FIG. 9A illustrates, in a block diagram, a computer that is programmed to insert, in accordance with the invention, one or more pipelines to reduce cycle time for shifting compressed data between an external interface and a combinational scan compression (CSC) circuit.

In several embodiments of the invention, a tool 999 (FIGS. 9A and 9B) automatically reduces limits on cycle time imposed by wire delay and combinational compressor/decompressor delay at both sides of an electronic device, namely input and output, by automatic insertion of at least two pipelines, also called "head" pipeline and "tail" pipeline. The respective additional storage elements in these pipelines are as follows: one or more "head" storage element(s) between an external compressed scan input port and a decompressor, and one or more "tail" storage element(s) between an external compressed scan output port and a compressor. FIG. 2C illustrates the use of such pipelines (also called "storage" pipelines) on both sides of circuit 100, in some embodiments of the invention.

Moreover, although the embodiments shown in FIGS. 2A and 2B illustrate the addition of a single storage element to a CSC circuit 100 to break up a path to/from an external interface of an electronic device into two portions, multiple storage elements can be used in other embodiments to break up such a path into more than two portions. For example, FIG. 2C illustrates use of two storage elements 203 and 204 to break up an ingress path 111J into three portions. If the three portions require the same period of time to traverse, then the limit on cycle time due to delay in shifting input data has been reduced to $\frac{1}{3}^{rd}$ (relative to not using the storage elements 203 and 204).

Figure 4A:
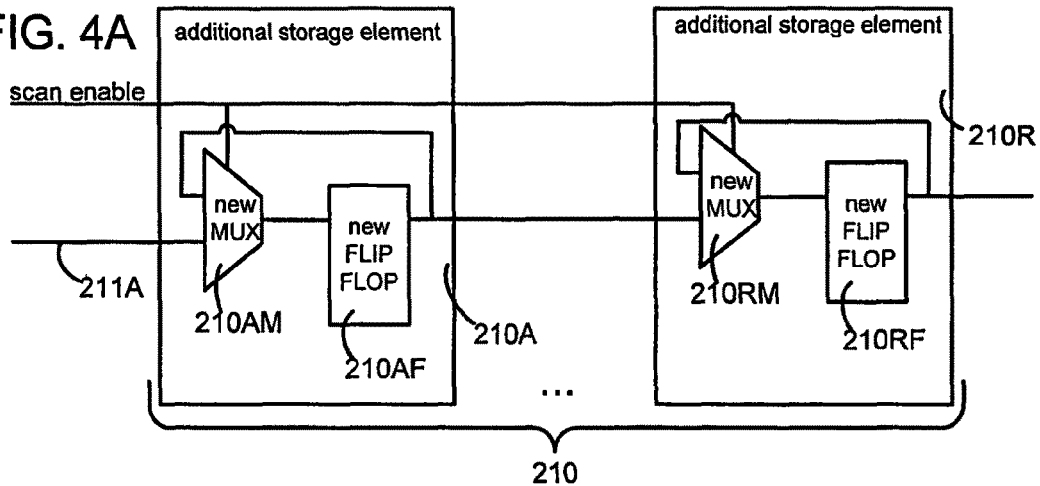
FIG. 4A illustrates a first embodiment of the invention wherein a pipeline is formed by addition of storage elements that are preconfigured to hold state during a capture cycle.
Figure 5A:
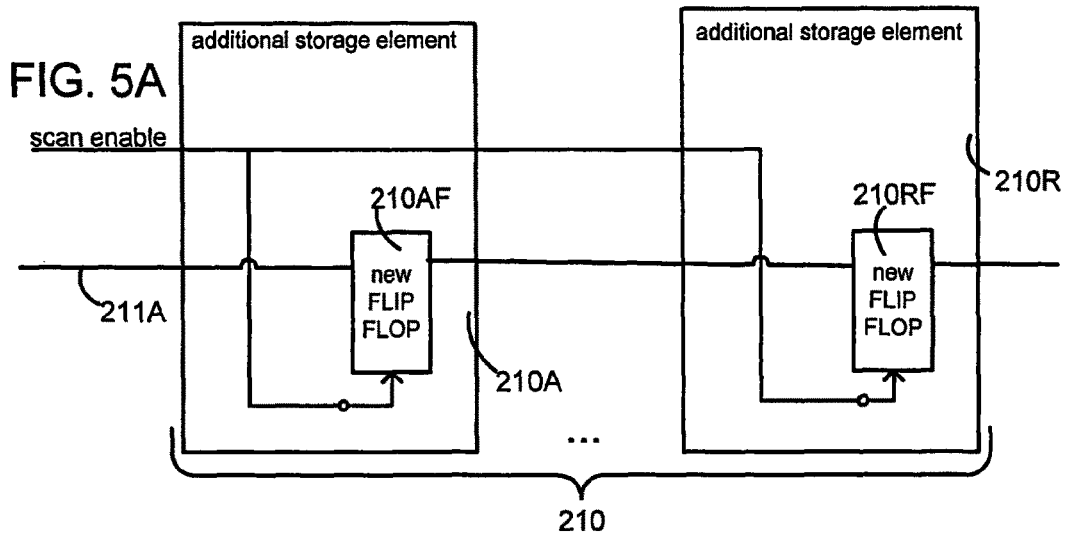
FIG. 5A illustrates a second embodiment of the invention wherein a pipeline is formed by addition of storage elements that are preconfigured to store the value "0" during a capture cycle.
Figure 5B:
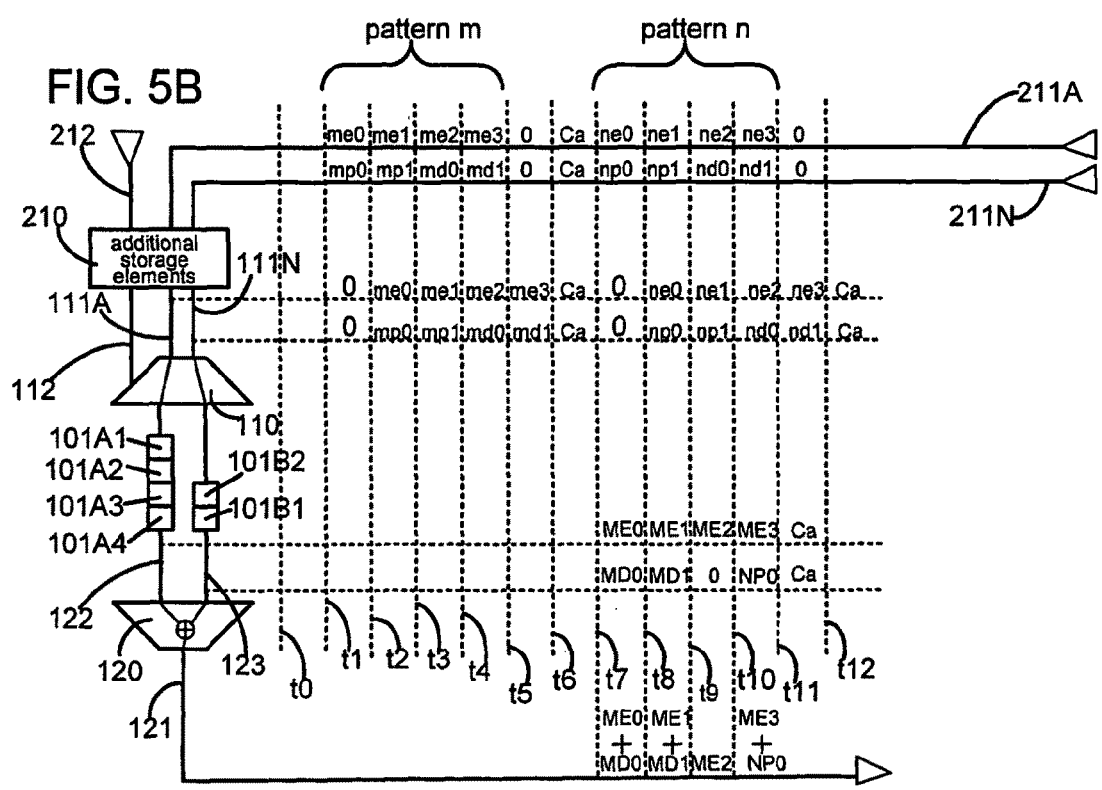
FIG. 5B illustrates in a timing diagram, signals on various lines of an electronic device that includes the pipeline of FIG. 5A.
Figure 6A:
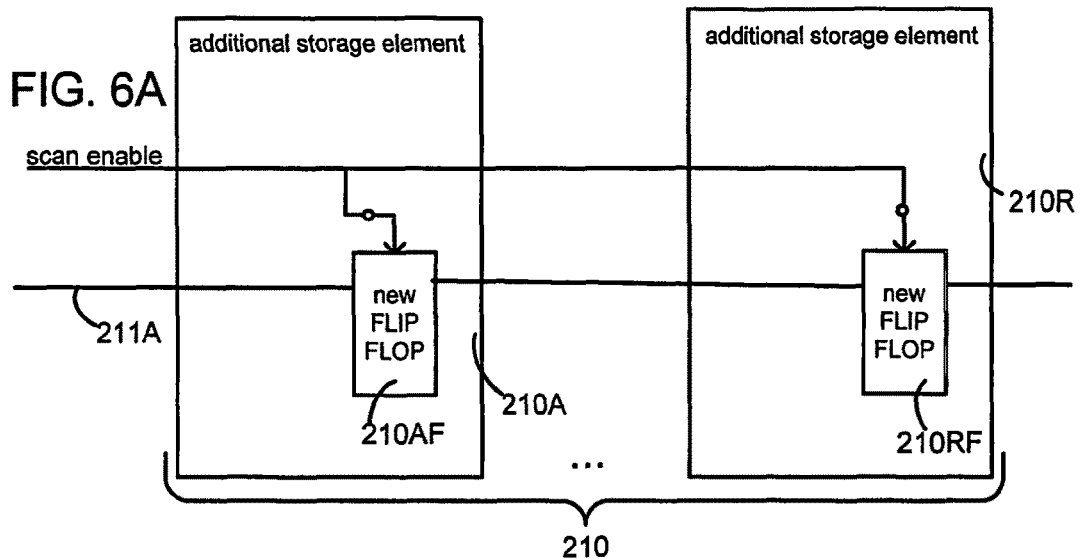
FIG. 6A illustrates a third embodiment of the invention wherein a pipeline is formed by addition of storage elements that are preconfigured to store the value "1" during a capture cycle.
Figure 6B:
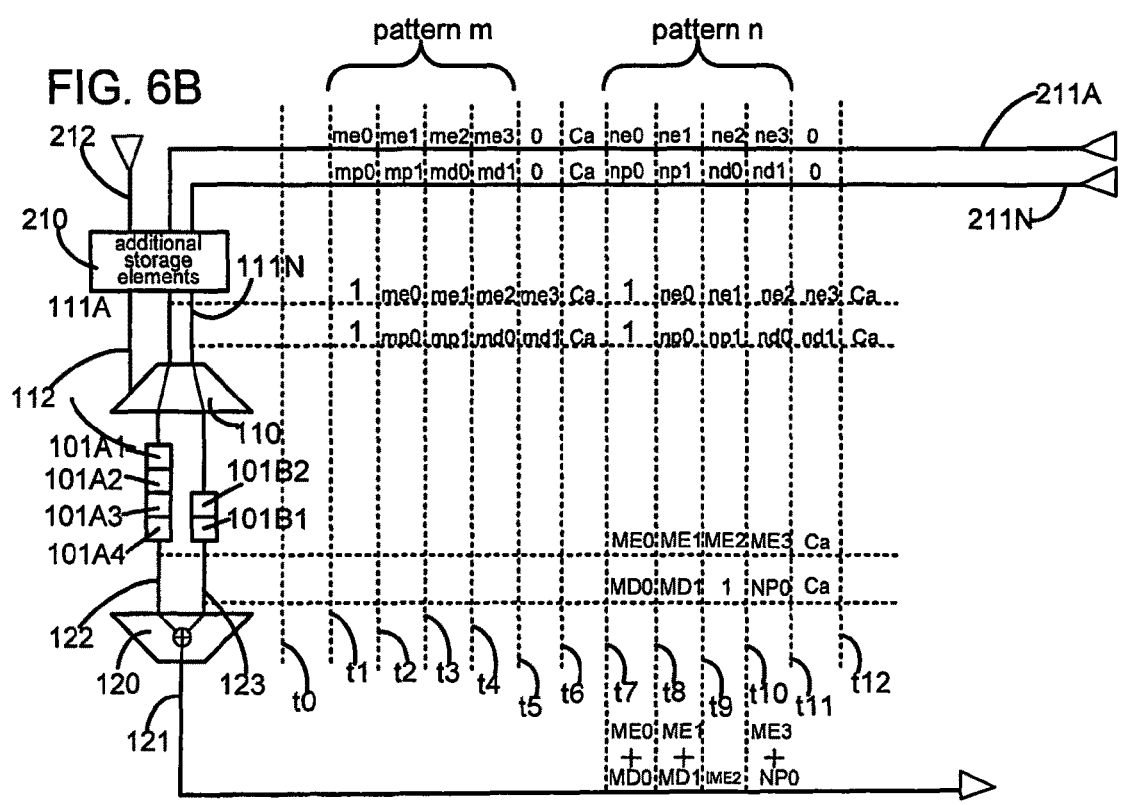
FIG. 6B illustrates in a timing diagram, signals on various lines of an electronic device that includes the pipeline of FIG. 6A.
Figure 7A:
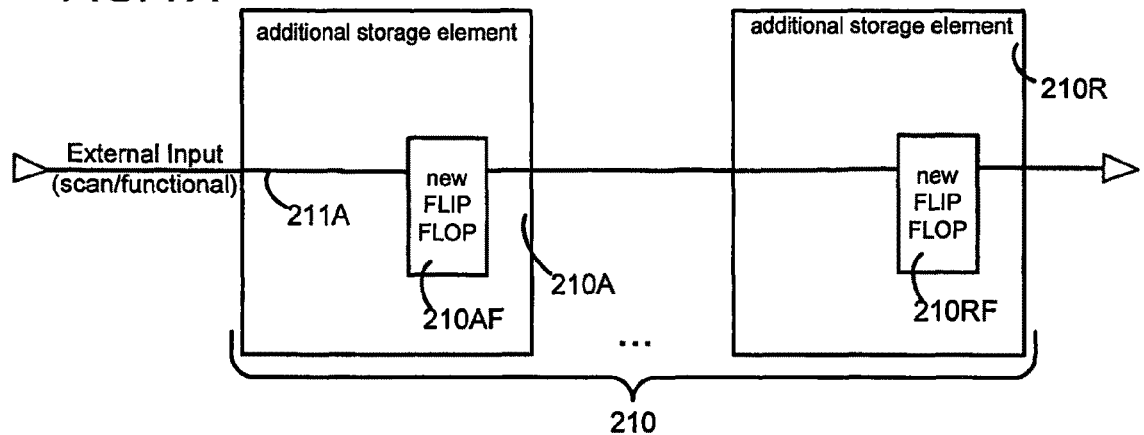
FIG. 7A illustrates a fourth embodiment of the invention wherein a pipeline is formed by addition of storage elements that are preconfigured to load a value from input during a capture cycle.

In this manner, a tool 999 in accordance with the invention uses any number and/or any type of storage elements to break up a path at ingress or egress of CSC circuit 100 into any number of portions, that are made sufficiently small to reduce limits on speed of shifting compressed data to/from an external interface of an electronic device. Specifically, in an act 251, tool 999 receives a specification of pipeline depth, e.g. specified by a user or by another tool. A specification of pipeline depth can based on any factors, such as layout, delay, routing etc. Next, in act 252, tool 999 instantiates a number of storage elements that are to be added as stages of a pipeline to CSC circuit 100. In one embodiment, the storage elements that are instantiated are all of the type illustrated in FIG. 4A, although in other embodiments other types as illustrated in FIGS. 5A, 6A and 7A may be used, either as the sole type or as different types in combination with one another (depending on the embodiment). The number of storage elements that are instantiated in some embodiments of act 252, for each input or output is equal to the respective depth of the input pipeline or output pipeline.

Figure 2D:
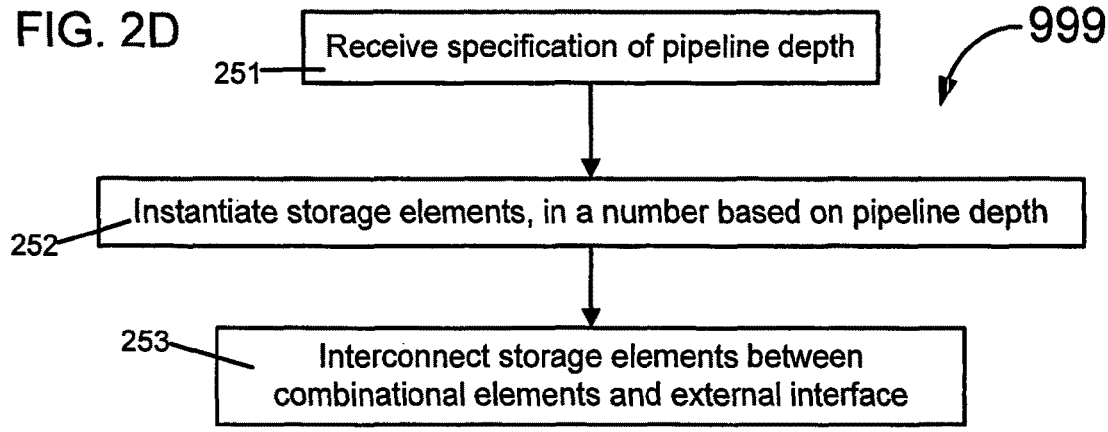
FIG. 2D illustrates, in a high-level flow chart, acts performed by a tool 999 that inserts pipeline stages in accordance with the invention, to stage the shifting of input/output data of a combinational scan compression circuit.

Next, in act 253, tool 999 interconnects storage elements which have just been added, to combinational elements of CSC circuit 100, e.g. to its compressor and/or its decompressor. Other than the just-described interconnection, CSC circuit 100 remains unchanged on completion of method 250 illustrated in FIG. 2D. Also in act 253, tool 999 connects newly-added storage elements to an external interface. Note that a cumulative path between a combinational element and an external interface, via newly-added storage elements is typically different from a corresponding path prior to addition of these storage elements, because the precise placement of the newly-added storage elements and routing to/from them depends on one or more other tools, e.g. layout tools.

One or more additional storage element(s) that are inserted by tool 999 along a path to break it up in accordance with the invention form a pipeline as noted above. Accordingly, a pipeline in accordance with the invention shifts compressed data in stages, across small portions of an otherwise long path between the external interface and one of the combinational elements. Staged shifting as just described can reduce cycle time. For example, the cycle time for shifting scan data can be made no more than the longest time required to traverse a stage of a pipeline, if time for data transfer between adjacent scan cells in a scan chain is small. The reduced cycle time in turn enables a corresponding increase in frequency ("shift frequency") at which the data can be shifted through scan chains.

Figure 3:
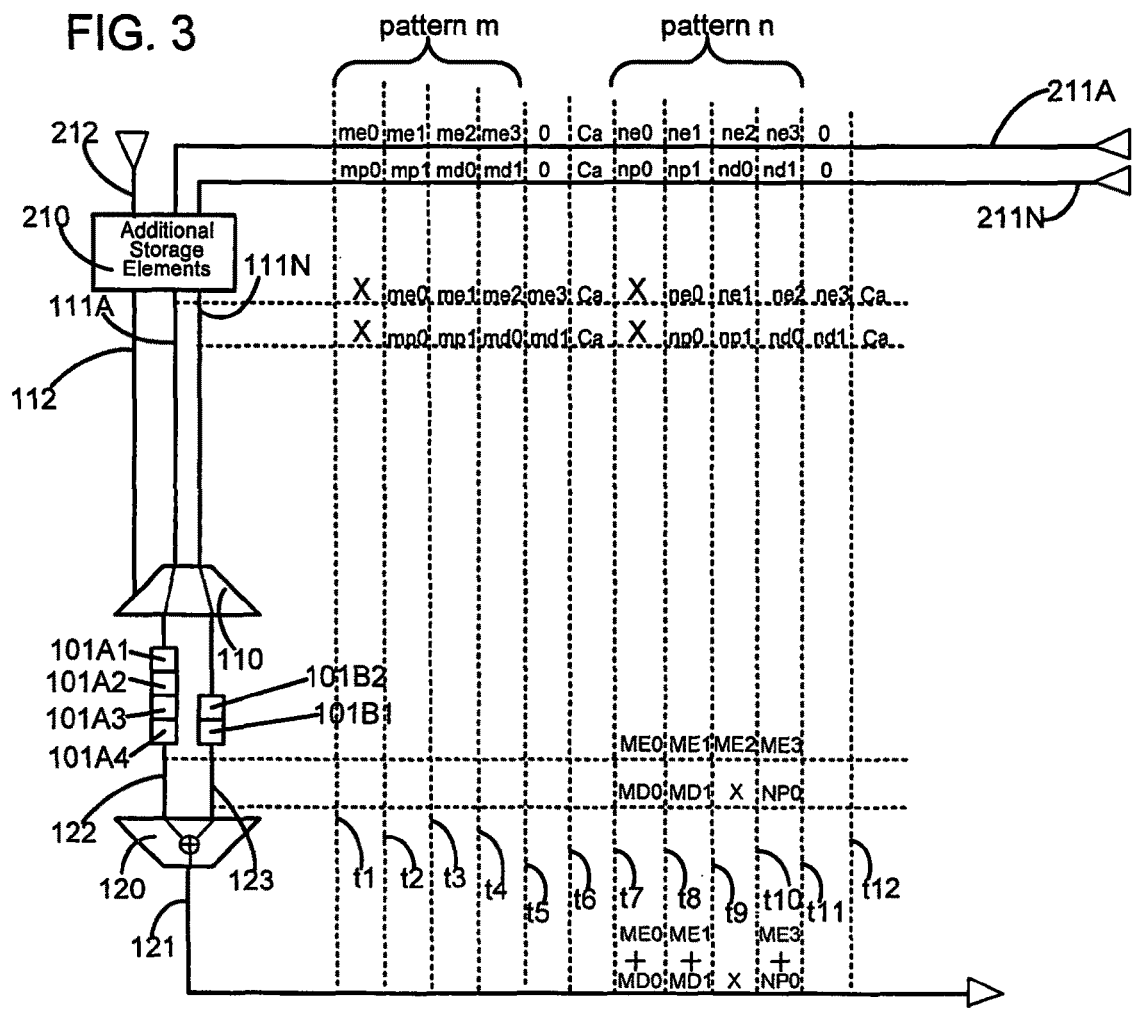
FIG. 3 illustrates in a timing diagram, signals on various lines of an electronic device that includes additional storage elements in accordance with the invention.

Use of additional storage elements as pipeline stages can raise issues that are easily addressed by a skilled artisan in view of this disclosure. For example, an issue arises when there is an overlap in (a) reading the results of a current test pattern and (b) loading a next test pattern. This particular issue is illustrated in FIG. 3, wherein reading of the results of a current test pattern "m" overlaps with the loading of new test pattern "n." Specifically, in FIG. 3, the length of one scan chain 10A1-A4 is different from (e.g. larger than) the length of another scan chain 101 B2-101B1. In this situation a couple of padding bits np0 and np1 are supplied on input terminal 211N at the respective times t7 and t8. However, the data that is output at time t9 is based on a value X that is latched into the additional storage element (added to form the pipeline) during the capture cycle. If this value X is unknown, then the corresponding result on line 121 cannot be easily computed even with access to additional information about the state of circuit 100.

Accordingly, in several embodiments, additional storage elements of an ingress pipeline 210 (FIG. 3) which is added in accordance with the invention to break up an ingress path, are configured differently from a prior art scan cell that uses a multiplexer driven by logic 101. In a first embodiment of the invention, a mux in a storage element (which forms a pipeline stage) has as one of its inputs, an output of a flip-flop in that pipeline stage and furthermore, an input of the flip flop in that pipeline stage is coupled to an output of the multiplexer. As a consequence of this specific configuration of the pipeline stage, each pipeline stage in such embodiments becomes a state-holding element, which retains the current state in a flip-flop, when a scan enable signal is active (during capture cycle). As shown in FIG. 4A, the output of flip flop 210AF is coupled to the input of mux 210AM that in turn feeds the same signal back as an input to flip flop 210AF, thereby to form a feedback loop.

Figure 4B:
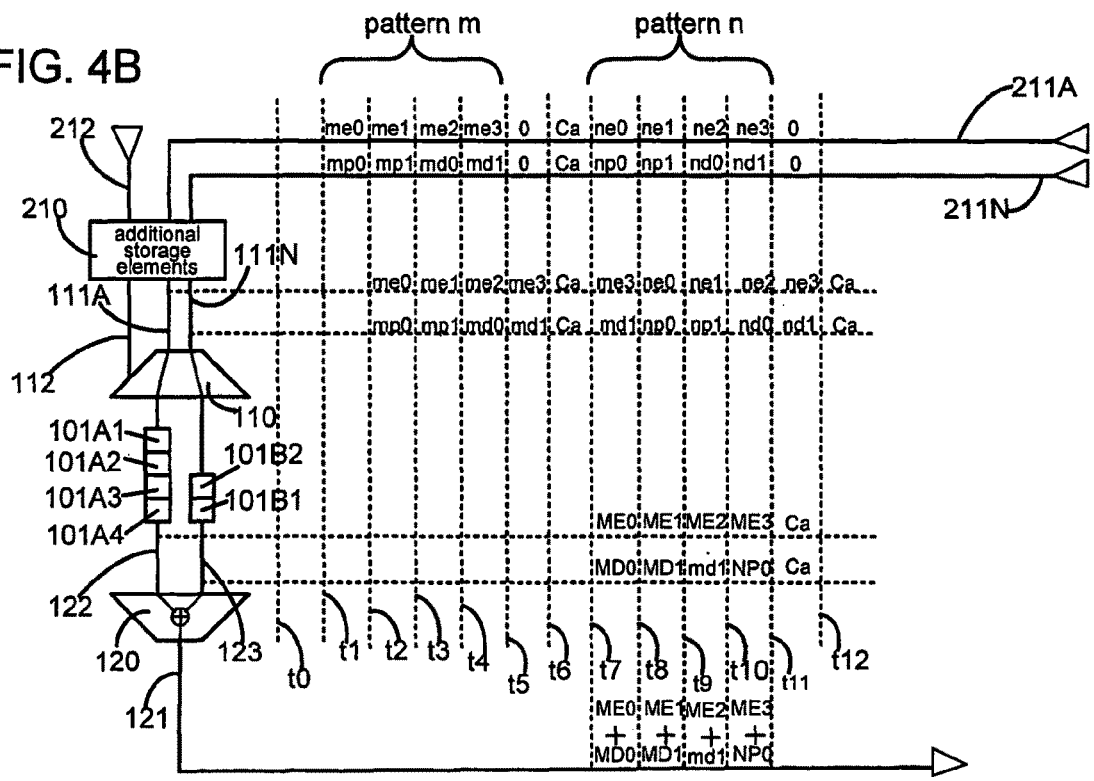
FIG. 4B illustrates in a timing diagram, signals on various lines of an electronic device that includes the pipeline of FIG. 4A.

Referring to FIG. 4B, at time t7, a signal on line 121 at the output of decompressor 120 depends on the corresponding values at the input of compressor 110 at time t2. More specifically, the output of circuit 100 is shown in FIG. 4B as the value ME0+MD0, wherein ME0 is the captured version of me0 and MD0 is the captured version of md0 and "+" indicates exclusive OR (i.e. XOR). The effect of feedback described above does not occur until time t9 (FIG. 4B), at which time the signal on line 121 depends on values ME2 and md1.

Figure 7B:
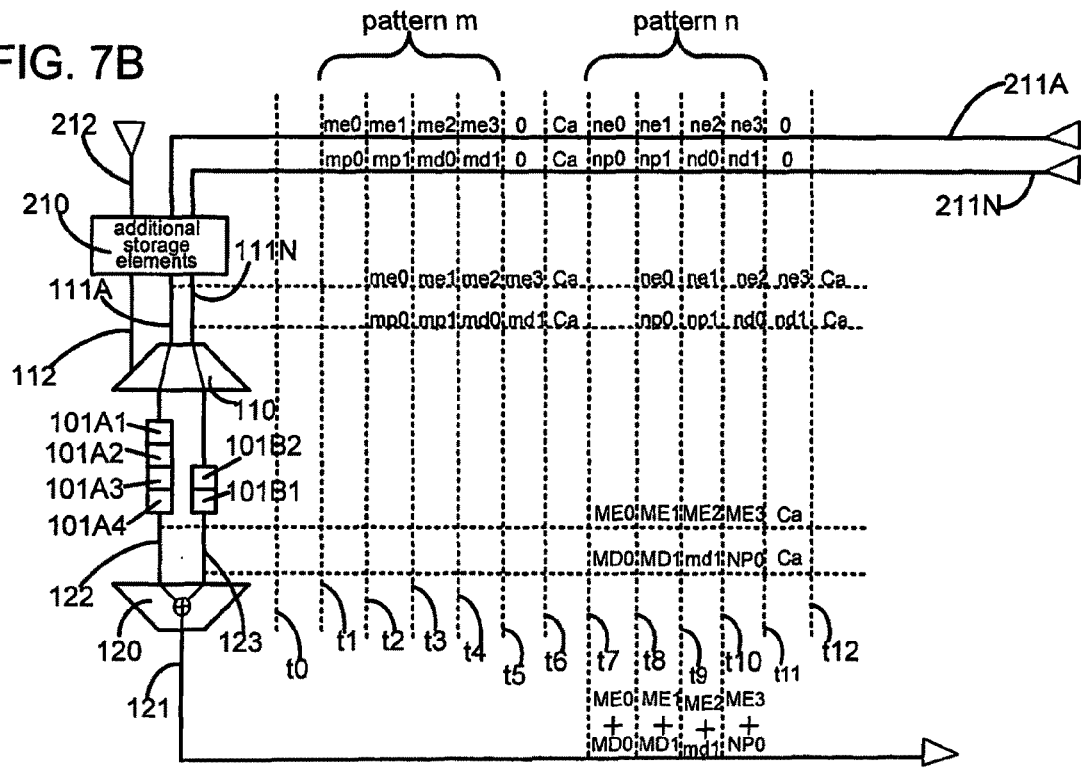
FIG. 7B illustrates in a timing diagram, signals on various lines of an electronic device that includes the pipeline of FIG. 7A.

In two alternative embodiments, the stages of a pipeline are configured to generate predetermined signals, namely 0 or 1 as shown in FIGS. 5A-5B and FIGS. 6A-6B respectively. Specifically, in FIG. 5A, a scan enable line is coupled via an inverting buffer to the reset input of a flip-flop 210AF, which constitutes a storage element 210A of pipeline 210. Accordingly, when the scan enable signal is inactive (in a capture cycle), a 0 value is supplied at an output of storage element 210A in FIG. 5A, by the flip-flop 210AF which is placed in reset. Similarly, a scan enable line may be coupled via an inverting buffer (shown as a bubble) to a set pin of the flipflop in a storage element, as shown in FIG. 6A. In these embodiments, ATPG tool 917 is configured to generate appropriate results, based on the respective value 0 (or 1) generated by the storage element of a pipeline, during the capture cycle. For example in FIG. 6B, at time t9, the result on line 121 is the inverted value !ME2 which results from the exclusive OR of the value "1" and ME2. In a third alternative embodiment, the pipeline stages are configured to simply load a signal at external input, as shown in FIGS. 7A-7B. As the signals at external input are known to ATPG tool, which created the signals used during testing with the pipeline shown in FIGS. 7A-7B, the ATPG tool is configured to generate the appropriate result.

With knowledge that additional storage elements 210A and 210R are configured to hold state during the capture cycle, an ATPG tool 917 (FIG. 7B) is configured to generate appropriate results, e.g. tool 917 in some embodiments is configured by pipeline support logics 997 and 998 (FIG. 7B). Logic 997 provides pipeline support for design rule check (DRC) tests which are performed using ATPG tool 917. More specifically, logic 997 implements a method to identify pipelining storage elements and, for example, to check that input pipeline storage elements hold state. Also, logic 998 provides pipeline support for generation of tests to be performed using ATPG tool 917. More specifically, logic 998 adjusts patterns for a number of reasons and in a variety of ways as discussed herein. Each of these two logics is described next, in reference to FIGS. 8A-8C.

Specifically, as illustrated by act 801 in FIG. 8A, logic 997 receives as its input, a number of input pipeline stages (NIPS), and also receives a number of output pipeline stages (NOPS). In some embodiments, these values are read in during parsing of the DRC protocol. Next, as per act 802, logic 997 identifies all pipeline stages in a pipeline path by using precalculated shift simulation value to trace the path, from an output pin of a compressor through sensitized gates, until NOPS stages are traced. In act 802, logic 997 also records the location of the pipeline path's input pin and also records any inversion parity between it and the output pin. Inversion parity is illustrated in FIG. 2C by a bubble 299 between output pin 120Q of compressor 120 and input pin 205QI of additional storage elements 205Q. In this example, a path that is traced in act 802, is from pin 120Q to pin 205QI. The just-described act 802 is performed repeatedly, for each output pin of compressor 120. Act 802 is performed in many embodiments, during a DRC process for ATPG.

Next, as per act 803, logic 997 identifies all pipeline stages in the pipeline path again by using precalculated shift simulation values to trace the path from an input pin of a decompressor through sensitized gates, until NIPS stages are traced. In act 803, logic 997 also records the location of the pipeline path's output pin and any inversion parity between it and the input pin. Note that in act 803, all stages of these pipeline paths are checked to ensure they hold state during the capture operation, as required by some embodiments of the invention (of the type shown in FIGS. 3A and 3B). The just-described act 803 is also performed repeatedly, for each load decompressor input.

Next, in act 804, verification of unload compressor operation (part of ATPG tool 917) and verification of scan chain operation (also part of ATPG tool 917) are modified so that each unload compressor output is adjusted, to be the calculated pipeline stage input with its associated inversion parity. Note that calculation of pipeline stage input is readily apparent to the skilled artisan in view of this disclosure.

Finally, in act 805, verification of load decompressor operation (part of ATPG tool 917) and verification of scan chain operation (also part of ATPG tool 917) are modified so that each load decompressor input is adjusted to be the calculated pipeline stage output with its associated inversion parity. Note that calculation of pipeline stage output is readily apparent to the skilled artisan in view of this disclosure.

Figure 8B:
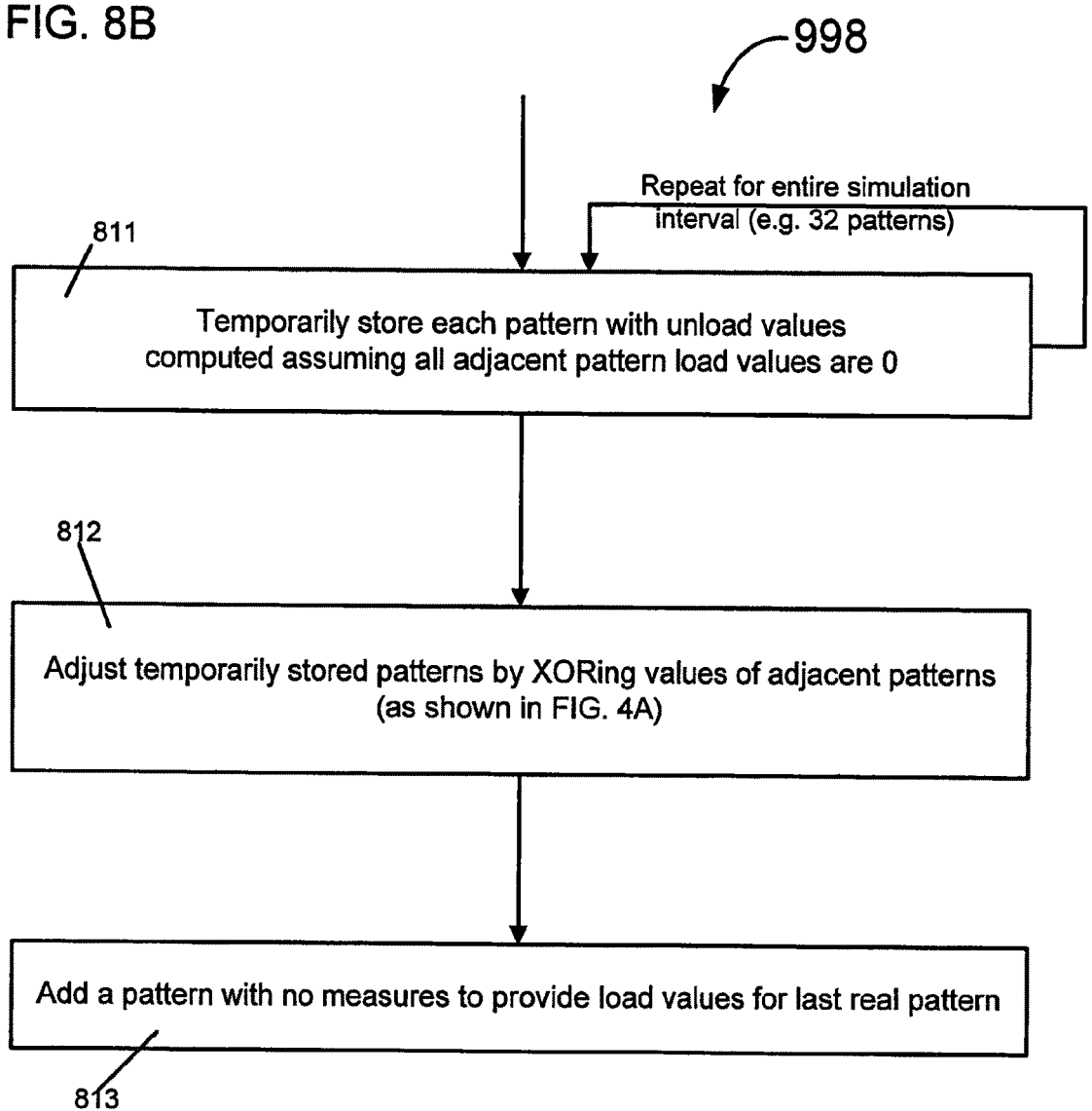

Moreover, as illustrated by act 811 in FIG. 8B, logic 998 temporarily stores each pattern with unload values that are computed assuming all adjacent pattern load values are 0. Note that this is just a temporary assumption. Act 811 is repeated for the entire simulation interval (e.g. 32 patterns). Next, in act 812, logic 998 adjusts temporarily stored patterns by XORing the values of adjacent patterns, e.g. as shown in FIG. 4A. Finally, at the end of a pattern set, a pattern, which contains no measures, is added to provide load values for the unload of the last real pattern.

Also, as illustrated by act 831 in FIG. 8C, when pattern re-ordering needs to be performed, logic 998 adjusts patterns by XORing with values of adjacent patterns, e.g. as shown in FIG. 4A. Note that act 831 is also repeated, for an entire simulation interval (e.g. 32 patterns). Next, in act 832, the patterns are reordered as required. Finally, as per operation 833, the above-described acts 821-823 of FIG. 8B are performed.

Note that the adjustment for a subset of patterns also follows the procedure set forth above in reference to acts 821-823 of FIG. 8B. Note further that in some embodiments, there are at least two different adjustment zones. Firstly, load decompressor inputs are adjusted by some embodiments based on adjacent pattern dependencies, as noted above in reference to FIG. 4A. Secondly, unload compressor outputs are adjusted by shifting the observed values forward by the number of pipeline output stages (NOPS). The first NOPS unload values are masked(X).

Note further that in some embodiments, there is a third adjustment zone when using pipelining with storage elements to reduce cycle time of an X-tolerant compressor. In such embodiments, the unload control inputs are adjusted by shifting the desired value back by the number of pipeline input stages. This implies that some values loaded for the unload of pattern n may be shifted back to the load of pattern n–1. Note that X-tolerant compressors (to which pipelines may be added, as described in reference to FIG. 2D) are described in an article by P. Wohl, J. Waicukauski, S. Patel and M. Amin entitled "X-Tolerant Compression and Application of Scan ATPG patterns in a BIST architecture," Proc. of International TestConference, pp. 727-736, 2003, which is incorporated by reference herein in its entirety. For another illustrative use of pipelining as described herein with X-tolerant compressors, see SECTION B below.

Figure 9B:
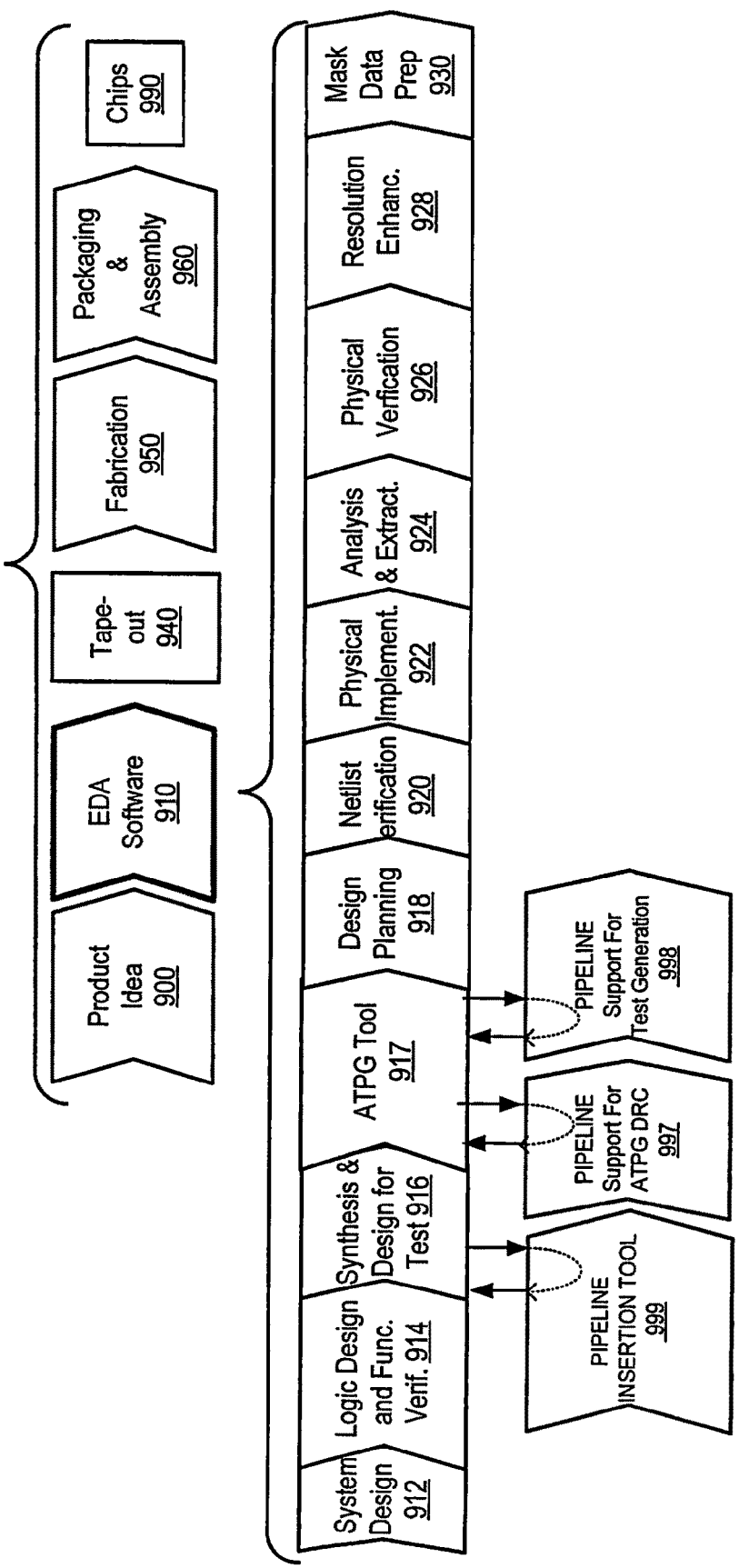
FIG. 9B illustrates a simplified representation of an exemplary digital ASIC design flow that uses a pipeline insertion tool, in accordance with the invention.

Accordingly, the circuitry illustrated in FIGS. 2A-2C is used in some embodiments of an EDA software design process (shown as 910 in FIG. 9B). Process 910 (FIG. 9B) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a gate level netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products. Note that a tool 999 (of the type described below in reference to FIG. 2D) can be used in an iteration through this stage 916, as shown in FIG. 9B.

ATPG tool (stage 917): Here, the IC design is input to an automatic test pattern generation (ATPG) tool to generate test patterns, to be applied to the IC after fabrication. Exemplary EDA software products from Synopsys, Inc. that can be used at this stage include the TetraMAX® ATPG product, as well as DFT MAX products (such as RTL TestDRC and Full-Scan DFT). Note that two tools 997 and 998 (of the type described above in reference to FIGS. 8A-8C) can be used in an iteration through this stage 917, as shown in FIG. 9B.

Design planning (stage 918): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime® products (applied to pre-layout IC designs). Note that timing analysis at this stage is performed in PrimeTime® based on simplified models that do not take into account capacitive coupling and crosstalk.

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro, IC Compiler product. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this includes Star RC/XT, Raphael, Aurora and PrimeTime® SI products (applied to post-layout IC designs). Note that timing analysis at this stage is performed in PrimeTime® SI based on capacitive coupling and crosstalk models.

Physical verification (stage 926): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 928): This involves geometric manipulations of the layout to improve manufacturability of the design. Exemplary EDA software products from Synopsys, Inc. that can be used at this stage include iN-Phase, Proteus, and AFGen products.

Mask data preparation (stage 930): This provides the "tape-out" data for production of masks for lithographic use to produce finished chips. Exemplary EDA software products from Synopsys, Inc. that can be used at this include the CATS(R) family of products. Actual circuitry in the real world is created after this stage, in a wafer fabrication facility (also called "fab").

The data structures and software code (a plurality of instructions) for implementing one or more acts described in this detailed description (e.g. see FIGS. 2D and 8A-8C) can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs).

Note that a computer system used in some embodiments to implement tool 999 of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Numerous modifications and adaptations of the embodiments described herein will become apparent to the skilled artisan in view of this disclosure.

For example, although certain kinds of storage elements based on flip flops are illustrated in FIGS. 4A, 5A and 6A, certain other embodiments use other kinds of storage elements which are based on, for example, latches (instead of flip flops). Similarly, although certain kinds of storage elements based on flip-flops and multiplexers are illustrated in FIG. 4A, other embodiments use other kinds of storage elements which are based on, for example, flip-flops and AND or OR gates (instead of multiplexers). As yet another example, although a signal at the Q output pin of a D flip-flop is illustrated in FIG. 4A as being fed back to the input of the multiplexer (both being newly added in accordance with the invention), certain other embodiments use a signal at the !Q (i.e. inverse Q) output pin to drive the input of the multiplexer and hence an inverted form of a current signal in the flip flop is latched during the capture cycle. Such an inverted form of the latched signal is taken into account by related software (such as one or more of tools 997-999).

Accordingly, numerous modifications and adaptations of the embodiments described herein are encompassed by the scope of the invention.

The following SECTIONS A and B are integral parts of this detailed description and are incorporated by reference herein in their entirety. These sections provide further detailed description of implementations for using illustrative embodiments of the type described above.

Section A

Minimizing the Impact of Scan Compression

Subsection A1—Introduction:

Scan has long been the fundamental design-for-test (DFT) method to control test costs and aid silicon debug and fault diagnosis. However, its effectiveness has eroded as the number and size of scan test vectors has steadily increased—despite highly compacted vector sets generated with modern automatic test pattern generation (ATPG). To address the issues of increasingly complex designs, large test pattern sets, and expensive ATE pins, a form of scan compression is needed. Scan load data is compressed during test generation and decompressed during test application.

Scan load compression techniques exploit the relative scarcity of care bits in scan load data. Combinational methods are particularly attractive for their simplicity and low overhead in area, timing and design flow. ATE-based runlength encoding of test data is the simplest method, but it is limited by runlengths and by the increase in pattern count resulting from not using random fill. More general and ATE-independent, "Illinois Scan" uses a shared scan-input configuration, so that inputs of multiple internal scan chains are driven by the same external pin. The number of internal chains can be larger than the number of external pins, so scan chains can be shorter, reducing test application time. However, some faults cannot be tested in shared scan input mode because of the structural dependencies imposed, so additional "top-off" patterns are required in regular scan mode, in which the scan cells are reconfigured into fewer and longer chains. Top-off patterns limit both data and application time compression, and increase test-application complexity, because the ATE has to feed deeper chains in the top-off pass. Another technique, more general than Illinois Scan, is to insert a carefully designed XOR network between scan input pins and internal scan chains. XOR networks require greater silicon area than Illinois Scan, but because they provide more flexible compression, almost all faults can be tested in compressed mode.

Scan unload compression techniques exploit the fact that error values appear more or less randomly, and only on a few scan chains at a time. Compression methods independent of the test set and fault model necessarily result in some loss of data; multiple error values may mask each other (aliasing), and unknown values may mask error values from observation at a compressor output (X-masking). Designing compressors independent of the fault-model and pattern set is known in prior art; more recent work addressed compression in the presence of unknown output values (Xs) and included circuitry to mask selected unload values so that Xs do not reach the unload compressor, or selectively unloading a subset of scan chains and masking unknown values at the tester.

Combinational compression is preferred for its simplicity and can guarantee error detection even when another input is X; however, the large fanout and fanin result in large overhead. A graph-theory-based method to design low-area, low-delay compressors is known in prior art; however, the compression ratio is lower than other methods. Compressors that detect one error when two other inputs have unknown values can be derived from coding theory, and an indepth theoretical analysis of compression in the presence of unknowns is also known in prior art. Several constructions are given for the practical case of detecting one error when two inputs are unknown or multiple errors with fewer unknowns, but the compression ratio that is too low for practical applications. Steiner systems yield better compressors, but do not exist for arbitrary sizes and are, in fact, quite sparse; optimal compressors can be obtained through an NPcomplete search algorithm, but this is practical only for small sizes. Special X-filtering hardware can be added to ECC-based compressors to reduce X-masking effects but requires additional area and input data, and is limited to a small number of unknowns.

The method presented here minimizes impact in all aspects of design flow, area and timing. Small, independent combinational circuits are added to the inputs and outputs of the internal scan chains; the design under test is not modified—for example, primary inputs (PIs) and primary outputs (POs) need not be wrapped and X-sources in the design need not be blocked (FIG. 1B). Subsection A2 describes the novel load data decompressor, subsection A3 the unload data compressor and subsection A4 the complete flow. The modified ATPG process is presented in subsection A5, with results presented in subsection A6; and subsection A7 concludes this section A.

Subsection A2—Load Decompressor:

A load decompressor comprises a novel, multimode shared scan-in architecture, implemented with multiplexer (MUX) gates. Unlike the load compressor is DUTindependent and a different input sharing configuration can be chosen at every shift (FIG. 1B). Each internal scan chain is fed by a MUX and all MUXs share the mode inputs, which appear to the external tester as regular scan input pins (FIG. 1C). MUX gates are more general than XOR gates—an XOR is a special case of a MUX with inverted data inputs—and can provide greater flexibility in allowing scan in sharing without significant dependencies between scan chains. Also, the mode pins and MUXs can be used to reconfigure the scan cells into regular scan chains, without compression.

The load decompressor is designed to minimize dependencies (i.e., chains loading the same data in any mode), which could result in increased pattern count and loss of test coverage. For C internal chains, M modes and L load inputs the load decompressor can be designed to ensure that any two chains are independent in at least one mode if $L^M \geq C$. The load decompressor can be obtained by connecting chains to inputs, for each mode, as successive M-digit numbers in base L. By construction, any two chains connect to different inputs in at least one mode because each chain is represented by a different M-digit number. Therefore, any two care bits in the same shift can be mapped to input pins. For example, for M=2 modes (mode 0 and mode 1), L=4 load inputs (0, 1, 2, 3), C=16 chains (a, b, ..., p) can be connected as shown in Table 1 below.

TABLE 1

Chains independent in at least one mode

| chain: | | | | | | | | | | | | | | | |
|---|---|---|---|---|---|---|---|---|---|---|---|---|---|---|---|
| a | b | c | d | e | f | g | h | i | j | k | l | m | n | o | p |

| | a | b | c | d | e | f | g | h | i | j | k | l | m | n | o | p |
|---|---|---|---|---|---|---|---|---|---|---|---|---|---|---|---|---|
| mode 0 | 0 | 1 | 2 | 3 | 0 | 1 | 2 | 3 | 0 | 1 | 2 | 3 | 0 | 1 | 2 | 3 |
| mode 1 | 0 | 0 | 0 | 0 | 1 | 1 | 1 | 1 | 2 | 2 | 2 | 2 | 3 | 3 | 3 | 3 |

For instance, chain c connects to input 2 in mode 0 and to input 0 in mode 1. Note that chains a, f, k and p connect to the same input in both modes, thus do not require a MUX. The MUX-based load decompressor can ensure two chain independence for up to $C_{MUX} = L^M$ chains. In comparison, an XOR-based decompressor can use all $N = L + \lceil \log M \rceil$ input pins, but for an equivalent area, the XORs are limited to M inputs, because an M-input XOR has about the same area as an M-to-1 MUX. To ensure two-chain independence, each XOR must have a unique set of input connections. Therefore, the maximum number of chains for an XOR-based decompressor is determined as follows:

$$C_{XOR} = \binom{N}{1} + \binom{N}{2} + \ldots + \binom{N}{M}.$$

It can be easily shown that:
for M=2, $C_{MUX} > C_{XOR}$ for $L \geq 4$;
for M=3, $C_{MUX} > C_{XOR}$ for $L \geq 3$;
for $M \geq 4$, $C_{MUX} > C_{XOR}$ for $L \geq 2$.

Thus, the MUX-based decompressor can ensure two chain independence for more chains than an XOR-based decompressor of similar area. Chain-independence can translate into more faults tested per pattern, thus fewer patterns and higher overall compression.

If the maximum number $C_{MUX} = L^M$ of chains is used, then there are groups of L chains dependent in M−1 modes, because fixing M−1 digits leaves a single digit that can assume any one of L values. For example, L=4 chains a, b, c and d in Table 1 are dependent in mode 1. Therefore, any two chains can be set to desired values, but not all sets of three chains. For example, chains a, b and i (Table 1) cannot be simultaneously set to values 0, 1, 1. Another mode can be added to ensure that any two chains are independent in at least two modes if $L^{M-1} \geq C$. As before, the connections for the first M−1 modes are obtained as a (M−1)-digit numbers in base L. The last mode connection is obtained as the sum (mod L) of the first M−1 digits. Any two chains, ci and cj, independent in only one of the first M−1 modes, have, by construction, exactly one different digit in their (M−1)-digit connection number. Therefore, the sum of the first (M−1) digits of ci differs from the sum of the first (M−1) digits of cj, so the two chains will also differ in their last digit. For example, adding another mode to Table 1 results in the example illustrated in Table 2.

TABLE 2

Chains independent in at least two modes

| | chain: | | | | | | | | | | | | | | |
|---|---|---|---|---|---|---|---|---|---|---|---|---|---|---|---|
| | a | b | c | d | e | f | g | h | i | j | k | l | m | n | o | p |
| mode 0 | 0 | 1 | 2 | 3 | 0 | 1 | 2 | 3 | 0 | 1 | 2 | 3 | 0 | 1 | 2 | 3 |
| mode 1 | 0 | 0 | 0 | 0 | 1 | 1 | 1 | 1 | 2 | 2 | 2 | 2 | 3 | 3 | 3 | 3 |
| mode 2 | 0 | 1 | 2 | 3 | 1 | 2 | 3 | 0 | 2 | 3 | 0 | 1 | 3 | 0 | 1 | 2 |

When chains are independent in at least two out of three modes, it follows that any two chains are dependent in at most one mode and, further, that any three care bits in the same shift can be mapped to input pins. Let a, b, c be three arbitrary chains with care bits in the same shift; if all three have the same value, then the mapping is trivial and can be achieved in any mode. If chains a and b require opposite values, however, by definition, there are at least two modes for which chains a and b are independent and can be mapped to the required opposite values. Further, in at least one of the two modes chain c is independent of chain a, and in at least one of the two modes chain c is independent of chain b; thus chain c can also be mapped to its value. For example, chains a, b and i (Table 1) could not be simultaneously set to values 0, 1, 1, but they can be mapped in mode 2 in Table 2.

The load decompressor consists mainly of MUXs on the inputs of the internal chains. Each internal chain requires at most an M-to-1 MUX, which is equivalent to (M−1) 2-to-1 MUXs, each equivalent to 3 basic gates. However, many chains don't need a full M-to-1 MUX. Overall, the decompressor requires 3.9 gates per chain. In general, the area of the load decompressor can be estimated as M+1 equivalent gates per chain.

Subsection A3—Unload Compressor:

The unload compressor is designed through a novel method implemented in a computer that builds on Steiner systems, while balancing compression and X-tolerance, and minimizing silicon area. Because any single error must be observable at an output if there are no Xs, all chains are observed through a linear network of XOR gates (FIG. 1D)—any linear combinational compressor can be implemented as a fanoutfree network of XOR gates. To minimize silicon area, scan chain fanout is limited, typically to three outputs.

Simultaneous faults on two or more chains may "alias" each other i.e., the compressor output values are the same as for the fault-free design. Aliasing can decrease test quality because aliasing effects are not simulated and, thus, credit for fault detection might be assumed while the fault remained untested due to aliasing. An unload compressor can ensure that there is no aliasing of any two simultaneous errors if each scan chain connects (via XOR) to a unique, non-empty subset of the Q outputs, thus the number of chains C is limited by $2^Q - 1 \geq C$. If each chain connects to a unique subset o an odd number of outputs then no aliasing of any two, three and any odd number of simultaneous errors can be guaranteed, and C is limited by $2^{Q-1} - 1 \geq C$.

Unknown values (X) render all outputs they propagate to unusable for the current cycle and thus may mask errors from being detected. The effect of Xs is simulated and fault detection credit is given only if the fault effect propagates to at least one non-masked unload compressor output. X-masking can not only reduce test coverage, but also reduce the number of faults detected per pattern, and thus increase pattern count.

The unload compressor can ensure no error masking for one X value if all chains have the same fanout, q, and each chain connects to a unique subset of q outputs, so $$\binom{Q}{q} \geq C.$$

Figures 14, 15:
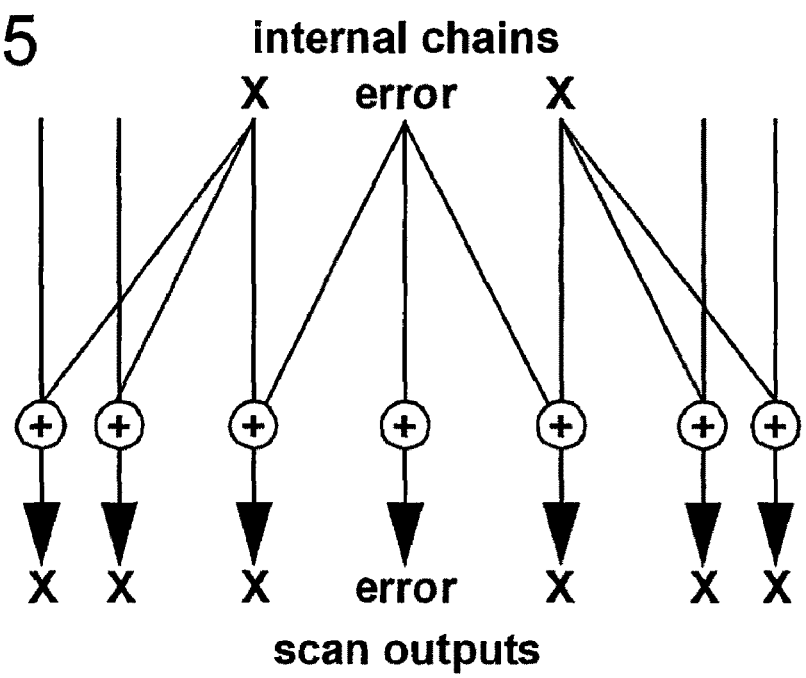
FIG. 14 illustrates in tables, unload control generation, specifically cost tables and final assignments
FIG. 15 illustrates in a graph, detection of one error in the presence of two Xs, further described in SECTION B below.

To guarantee detection of one error in the presence of two unknowns (Xs), each chain must connect to at least q=3 outputs so that any two chains share at most one output (FIG. 15). To ensure no error masking in the presence of more than two Xs would require chain fanout greater than three, which would increase silicon area too much, so we limit chain fanout to q=3. One error detection in the presence of two X values implies that two errors can be detected with one X, or three errors with no Xs. Let chain a connect to outputs x, y and z; therefore, chain a connects to output pairs (x, y), (x, z) and (y, z), and no other chain can connect to any of these pairs. Each chain "uses" three outputs pairs out of a total of $$\binom{Q}{2},$$

therefore $$C \le \frac{\binom{Q}{2}}{3} = \frac{Q(Q-1)}{6}.$$

Compressors built with chain fanout three so that any two chains share at most one output are based on Steiner triple systems; a Steiner triple system (S3S) is a set S of Q elements together with a set T of triples of elements from S, such that every pair from S appears in exactly one triple. For compressors, S is the set of scan outputs, and T the set of scan chains, each connected to three outputs. From above equation, (mod 6) so that C is an integer. For example, Q=7, S={0,1,2,3,4,5,6}, T7={{0,1,3}, {1,2,4}, {2,3,5}, {3,4,6}, {0,4,5}, {1,5,6}, {0,2,6}}. This is the only S3S for Q=7; there are only two S3S's for Q=13 and 80 for Q=15, but over a billion for Q=19. In certain cases, Steiner triple systems appear to offer optimal solutions for a subclass of X-tolerant compressors. Because of their limited chain fanout and their tolerance to two X's, S3S's are an excellent choice for unload compressors. However, we had to find solutions to the known limitations of S3S's: (1) Steiner triple systems are sparse (i.e., they exist only for few values of Q); (2) They are hard to find; (3) They provide limited compression.

We addressed the first limitation by permitting sets of triples when Q is not 1, 3 (mod 6), relaxing the requirement that every pair from S appear in a triple in T; for example, for Q=6, T6={{0,1,3}, {1,2,4}, {2,3,5}, {0,4,5}}; pairs {0,2}, {1,5} and {3,4} are not used. In fact, any solution for T6 will leave at least three unused pairs.

METHOD for Hill-climbing search for S3S:

STEP0 initialize T={ }; all output pairs unused
STEP1. choose an unused output pair {i,j} if none then SUCCESS STOP
STEP2. choose a second unused output pair {i,k} if none then INCOMPLETE STOP
STEP3.a. if {j,k} unused {
add {i,j,k} to T
mark {i,j}, {i,k}, {j,k} as used
}
STEP 3.b. else if {j,k,p} in T {
remove {j,k,p} from T
mark {j,p}, {k,p} as used
add {i,j,k} to T
mark {i,j}, {i,k} as used
}
STEP3.c. else do nothing
STEP4. if same #T for #iter then INCOMPLETE STOP
else repeat back to STEP1.

We addressed the second limitation with a hill-climbing search METHOD as shown above, modified to allow incomplete sets of triples, so the algorithm may reach an INCOMPLETE STOP even if a complete solution exists. Impreciseness allows an optimal tradeoff between CPU time spent generating the S3S (i.e., the compressor) and CPU time spent generating test vectors with the resulting compressor. In many cases, however, hill climbing is successful at finding a precise S3S. The selection STEP1 and STEP2 (above) are random, so a different S3S is likely to be attempted each time the algorithm is run. STEP2 can fail either because a complete S3S was not found, or because Q is not 1, 3 (mod 6) so a complete S3S does not exist. STEP3 either adds a new triple to T (3.a), replaces a triple in T (3.b), or does nothing (3.c), so the number of triples in T never decreases—hence "hill climbing". STEP4 avoids infinite loops by placing a heuristic limit (#iter) on how many times the loop can be executed consecutively without increasing the number of elements in set T. Additionally, the entire METHOD is repeated until either the maximally possible set T has been found, or a second heuristic limit is reached (STEP1.b in the method shown below); the best solution found is kept for the latter case.

The third limitation is the maximal compression possible with combinational compressors based on Steiner triple systems; the compression is limited by $$\frac{C}{Q} \le \frac{Q-1}{6}.$$

For example, compression is 1 for Q=7, 4/3 for Q=9, 3 for Q=19, etc. We address this limitation by extending the hill-climbing search METHOD (previous paragraph) to allow imprecise sets of triples, i.e., allowing pairs from S to appear in more than one triple of T. The resulting compressor thus has a small probability of masking an error in the presence of two X values. Test quality is not reduced, however, because the effect of Xs is simulated and fault detection credit is given only if the fault effect propagates to a non-masked output.

Method to Search for incomplete, imprecise T:

step 1. repeat hill-climbing search METHOD until
step 1.a "enough" triples found, or
step 1.b max number of attempts reached
step 2. if not "enough" triples found, fill-in
step 3. if higher compression desired, repeat step 1.

Impreciseness is introduced in two ways. In the first way, a heuristic determines how many triples are "enough" for a given Q, and repeated attempts at finding a (possibly incomplete, but precise) set T are stopped (1.a). For example, if Q=37 the set T could have 222 triples, but if C=200, then obviously only 200 triples are needed. However, if C=220 the heuristic may stop at 215 triples, saving significant CPU time that would be spent searching for a more complete set. A few additional triples can be filled in (step 2) allowing some pairs to be reused, but only if the two other pairs in the new triple are used for the first time. The second, and much more significant, source of impreciseness is in step 3: A complete additional set of triples may be added, so now two sets, Ta and Tb, coexist; Ta is an S3S and Tb is a different, non-isomorphic, S3S. Therefore, every pair appears in two triples, one in Ta, and one in Tb. Evidently, the number of chains supported—and the compression—are doubled. If every pair of outputs appears in two triples, observation of an arbitrary chain, ci, is masked by two Xs if, and only if, one of the Xs is on one of the other 3 chains that share an output pair with ci and the other X is on one of the 2(Q−1) chains that share the last output with ci, so the probability of masking ci in the presence of two Xs is:

$$P_{mask} = \frac{6(Q-1)}{(C-1)(C-2)}, C = \frac{Q(Q-1)}{6}$$

For example, for Q=37, two co-existing Steiner triple systems support up to 444 chains, with a 2-X masking probability of only 0.4%. Additionally, single X values can never mask observability, and, with no Xs, single, double, and any odd number of errors can never alias each other. The unload compressor consists of XORs on the outputs of the internal chains. The total, unoptimized number of 2-input XORs is F-Q, where F is the total fanout of all internal chains—that is, if each chain connects, on the average, to q outputs, so the total number of 2-input XORs is. Common-term optimizations can reduce the number of XORs by about 33%; every 2-input XOR gate counts as 3 equivalent gates, bringing the area per internal chain to:

$$\frac{2(qC-Q)}{C},$$

which is about 2 q equivalent gates per internal chain. If each chain connects to 3 outputs, the unload compressor area is about 6 equivalent gates per internal chain, so the total area for the load decompressor plus the unload compressor in a typical configuration is less than 10 gates per chain.

Figure 10:
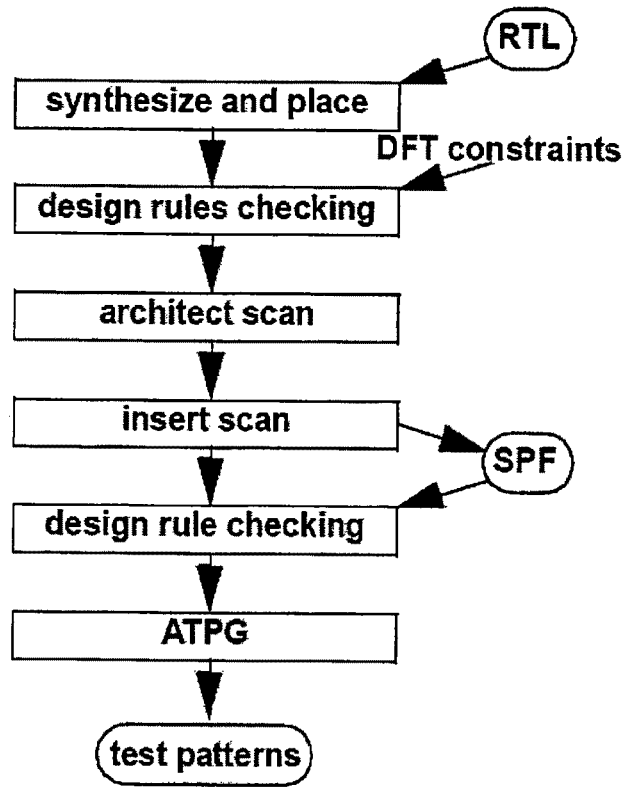
FIG. 10 illustrates a flow for a scan compression method described in SECTION A below.

Subsection A4—Flow:

The compression method presented introduces only a small amount of combinational logic into the design, and only on the input and output of scan chains, so it has no impact to existing flows in which scan chains are created in physically aware environments (FIG. 10). The ability to route the small amounts of combinational logic introduced does not adversely impact the ability to achieve layout successfully. Insertion of the test compression logic blends in with existing scan flows that have been proven over the years. The user does not see the difference and does not need to understand details of the compression architecture to reap its benefits.

Scan insertion requires the user to specify DFT constraints (second step in FIG. 10) such as the number of scan input/output pins in the design. Scan compression requires only one extra parameter—the desired compression factor. Scan architecting (third step in FIG. 10) and scan insertion (fourth step in FIG. 10) do not require any involvement from the user. The interface between DFT and ATPG is created by the DFT process and can be invisible to the user. The compressor and decompressor are described functionally in the STIL protocol file (SPF), next to the definition of the scan chains and the scan protocol. If desired, the user can fine tune the architecting of the compressor and decompressor, or design and use a different compressor altogether, independent of the DFT process, and create its functional description in the SPF. Additional design rule checks have been added to the design rule checking (DRC) suite of the ATPG tool (fifth step in FIG. 10) to support the compression technology; these rules can be grouped in to several classes:

Syntax checking of the SPF description. Consistency checking of the defined structures, such as the equivalence of the compressors' functional description from the SPF with the netlist, and verifying that all connections are made from input ports to the load decompressor, from the decompressor to the internal scan inputs, from the scan outputs to the unload compressor, and from the compressor to the output ports. Data loss checks, such as verifying that any two chains are independent in at least one mode, and that each chain has a unique unload signature. Also, a rule verifies that a single X does not mask observation of any other chain. X-checking rules identify X sources that can propagate to scan cells and unblockable X sources that will propagate to scan cells. This information can be used to tune ATPG options and/or change the design to obtain better results.

Subsection A5—ATPG Process

Test generation (sixth step in FIG. 10) was enhanced to create patterns consistent with the shared scan-in dependencies that result from the load decompressor, so the appropriate shared scan-in mode is determined for each shift of the load. Whenever a value is assigned to a scan cell during test generation, a search is made to determine whether any shared scan-in mode will allow the assignment. When a mode is found, all necessary assignments that result are immediately made. Note that this process would be more complex if an XOR-based decompressor were used. To minimize X-masking, test generation was also enhanced to make assignments that block X propagation to scan cells, when possible. Further, to support last-shift launch transition-fault patterns, test generation was enhanced to add an extra shift, so that transitions can be launched from the last scan cell of longest chains. The good machine simulator (also part of sixth step in FIG. 10) was enhanced to calculate the scan cell values from the compressed load data and to calculate the compressed unload data from captured scan cell values. The calculation of these values is performed using the functional description from the SPF. The simulator identifies unobservable scan cells that result from X masking and sets their captured value to X.

Note that unload values have a dependency on the overlapped load values of the next pattern, due to short chains whose captured scan cell values cannot contribute to all the shifts. Because the process cannot tolerate unnecessary X states, it is necessary to consider the load values of the next pattern when determining the unload values of a pattern. Also, an additional pattern must be added to the end of the pattern set to define the load values being used for the last unload. If the unload compressor satisfies the condition that all chains have a unique failing signature, then diagnosis can be performed directly on the failing pattern data.

An analysis is done during diagnosis to determine the failing cells from the unload failures. If there is only a single failing cell per shift, the failing cells can be identified and diagnosis can be performed. Failing patterns whose unload failures cannot be uniquely mapped to scan cells are ignored. If the failing scan cells cannot be uniquely identified, scan diagnosis can be enhanced to consider the effects of the unload compressor. Finally, if the preceding strategies are not successful, the patterns can be reconfigured as uncompressed scan patterns and the failing chip retested.

Subsection A6—Results:

The compression method presented was implemented in the integrated scan DFT flow and applied to 18 industrial designs ranging from 0.5 million to over 7 million gates. The compression target for these experiments was 10×, so the compressed designs were configured with 12× the number of internal scan chains vs. scan, to allow for a 20% pattern inflation over normal-scan. However, in most cases the actual pattern inflation was lower, thus the 10× compression target was exceeded. Results are compared with optimized normal-scan ATPG with dynamic compaction, for stuck-at faults and system-clock launch transition faults. The test coverage achieved when using compression (without any top-off patterns) is, on the average, the same as the test coverage in normal scan mode, except for designs 5 and 10 which lost several tenths of a percent stuck-at coverage due to excessive X-masking. For transition faults, there were no differences in test coverage for any of the seven designs.

The second metric compared is the CPU time for the complete ATPG run using compression vs. normal scan. For both stuck-at and transition, the compression ATPG run took about twice the time of normal scan ATPG. The increase is due to additional computation necessary to compress load and unload data, additional test-generation activity searching for a load decompressor mode that satisfies all care bits, blockage of some X-propagation to scan cells, and to slower fault dropping due to X-masking, requiring more fault simulation.

Data compression exceeded the 10× target for almost all designs for stuck-at and for all designs for transition faults. Cycles compression exceeded the 10× target for all designs in both fault models and was even higher than 12× in a few cases, due to better balancing scan chain lengths in the compressed flow. It is important to note that the results show only small variations across designs, so the compression method achieves predictable results, meeting expectations set by scan testing methodologies. The total area overhead is reviewed for a cross section of nine designs. Each design was run through the entire DFT scan-insertion flow twice-once with, and once without, compression. The difference in the number of gates was computed and divided by the number of internal chains. As expected, the average area overhead of all compression/decompression circuitry is only about 10 gates per chain.

A final set of experiments explored the applicability of the method for compressions above 10× for a design with a small number of same—shift unknowns. Results were reviewed for effective data and cycles compressions of 13, 21, 41, and 64. The test coverage was the same as normal scan for all compressions. As expected, CPU time increased with compression, but was no more than 3× at the highest compression. Although the total number of gates inserted increases with compression, the number of gates per chain is actually lower at higher compressions because of the increased number of chains.

Subsection A7—Conclusion:

We presented a scan compression method that is fully integrated in the scan synthesis and test generation flows and has minimal impact on area, timing, and design flow. The method comprises a novel combinational load decompressor and an unload compressor based on an innovative technique to reach an optimal tradeoff between compression and area overhead. Data and test application time compressions of over 10× were demonstrated on industrial designs, with acceptable ATPG time increase, and with no loss of test coverage. Compression, test quality, CPU time, and area are predictable, i.e., they vary little from design to design. Ongoing work addresses higher compression ratios; compression up to 64× has already been presented on some designs. Future work will also address high compression for designs with large numbers of unknowns and/or few pins, for which the X-tolerance of any combinational compactor is exceeded.

Section B

Fully X-tolerant Combinational Scan Compression

Subsection B1—Introduction:

Testing digital circuits accounts for a significant part of the cost to design, manufacture, and service electronic systems. Scan has long been the fundamental design-for-test (DFT) method to control test costs and aid silicon debug and fault diagnosis, but the number and size of scan test vectors is steadily increasing—even for highly compacted vector sets generated with modern automatic test pattern generation (ATPG). Cost-effective test requires a form of scan compression to address the issues of increasingly complex designs, large test pattern sets, and expensive and few automated test equipment (ATE) pads. Of particular interest are on-chip compression/decompression structures that only connect to scan chains and do not require Built-In Self-Test (BIST)-like design changes, such as unknownstate (X) avoidance, input/output wrapper cells and improved random testability. Combinational methods are particularly attractive for their simplicity and low overhead in area, timing and design flow.

Scan load compression techniques exploit the low density of care bits in scan load data. Several combinational load compression methods have been proposed, including: ATE-based run-length encoding, ATE-independent shared scan-in "Illinois Scan", XOR-based expander networks inserted between scan input pins and internal scan chains, and MUX-based load decompressors Scan unload compression techniques exploit the fact that error values appear more or less randomly, and only on a few scan chains at a time. Combinational unload compressors independent of the fault-model and pattern set include: compressors based on tiling, compressors that guarantee error detection in the presence of one unknown (X) value, graph-theory based low-area compressors, compressors tolerant of multiple unknown values, ECC-based compressors with special X-filtering hardware, and low-area compressors with 2-X tolerance.

The method presented in this paper builds on previous work that presented a combinational load/unload scan compression method designed to minimize the impact on all aspects of design flow, area and timing. Small, combinational circuits were added to the inputs and outputs of the internal scan chains, but the design under test remains unmodified—for example, primary inputs (PIs) and primary outputs (POs) need not be wrapped and X-sources in the design need not be blocked (FIG. 1B).

The load decompressor, designed to minimize dependencies (i.e., two scan chain loading the same value) was implemented with multiplexer gates, so that at every shift a different input sharing configuration can be chosen. The area added by the load decompressor is less than 4 gates per chain.

The unload compressor, based on Steiner Triple Systems, was designed to balance compression and X-tolerance while minimizing silicon area. Up to two Xs per shift can be supported with no loss of observability on any other chain; at the same time, the unload compressor enables direct diagnosis and minimizes error aliasing; its area is about 6 gates per chain. However, 2X-tolerant compressors can have lower observability than 1X-tolerant compressors if more than 2 Xs are present (see subsection B2.3 below).

Recent designs can often have more than two Xs per shift which exceeds the X-tolerance ensured by the method of FIG.

1B. Several factors can contribute to increase the number of Xs per shift: (1) Increased functional complexity of recent designs results in extended usage of RAMs, which are X-sources for basic-scan ATPG. Area and performance considerations often prevent adding DFT structures to block the Xs From propagating to scan cells, thus the overall number of Xs increases. (2) Aggressive timing of designs creates a large number of false paths that are modeled by X-ing out the values captured in scan cells during test application, thus also increasing the number of Xs. (3) Higher compressions require increased number of internal scan chains, thus increasing the number of Xs per shift even if the total number of Xs remained unchanged. (4) Test cost reduction drives the number of available ATE pins down, either by using low-cost testers, or by employing multi-site testing. Fewer pins implies fewer X's per shift can be tolerated by a combinational compactor before loss of observability occurs.

Our solution, presented in this paper, builds upon the previously introduced combinational load decompressor by providing unload controls to a new unload selector that works in conjunction with the unload compressor. This solution ensures no loss of observability irrespective of the number and distribution of Xs, without resorting to the complexity of sequential compression. Independent of the design, the test set or fault model, our method preserves all low-impact aspects of a combinational, scan-based flow. Subsection B2 below presents the general architecture and the details of the X-tolerant network. Next, subsection B3 describes the supporting DRC and ATPG algorithms, and subsection B4 outlines the flow and subsection B5 discusses the results. Finally, section B6 summarizes the conclusions.

Subsection B2—Fully X-Tolerant Architecture

Figure 11:
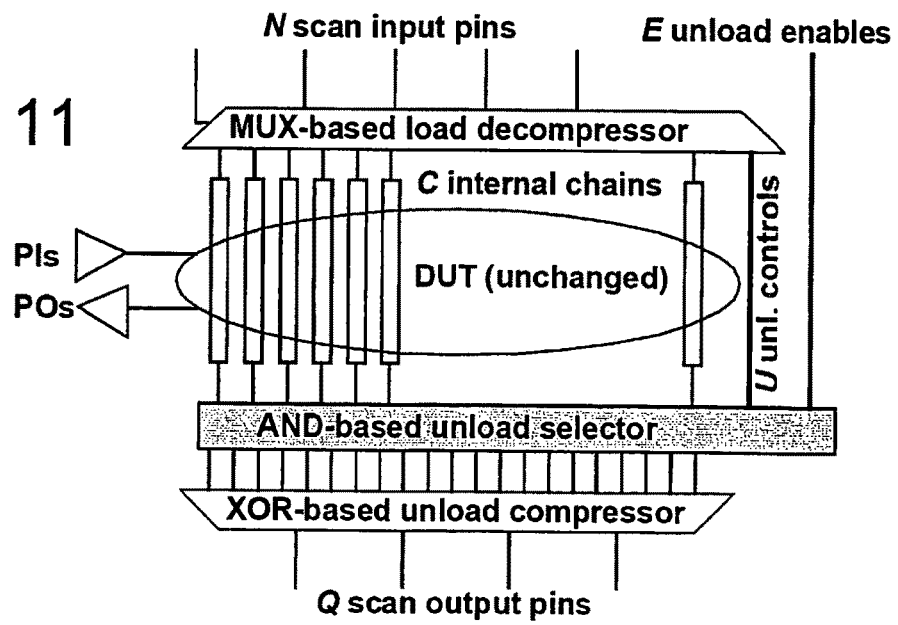
FIG. 11 illustrates an architecture of a compressor, as described in SECTION B below.

The architecture presented in FIG. 1B is extended by adding an unload selector between the outputs of the internal scan chains and the inputs of the unload compressor (FIG. 11). As before, circuitry is added only on the inputs and outputs of scan chains, and only combinational gates are added, maintaining a simple scan flow. In fact, the unload selector can be implemented with only a few AND gates (subsection B2.11) For most shift cycles, the unload selector functions transparently; it simply passes through unload values with no change, so that the architecture in FIG. 11 functions exactly as the one in FIG. 1B. This is sufficient for shift cycles where the unknown values, if any, do not mask any desired observability.

However, when needed, a group of exactly Q scan chains are selected for direct one-to-one observation at the Q outputs. In direct observation mode, the unload selector functions as a filter so that the unload compressor does not XOR together any of the unload values, thus 100% X-tolerance is guaranteed. Enough direct observation modes are provided so that every chain is directly connected to an output in at least one mode, therefore the architecture ensures no X-masking of the scan cell targeted for fault observation, no matter how many Xs are in other scan cells. To minimize pattern count, multiple faults must be observable during every unload. Consequently, to ensure every shift can observe targeted scan cells, the unload selector can choose a different group of Q chains every shift or, to maximize observability, it can choose to function transparently.

Lastly, all Q scan chains can be observed in a singlefanout XOR mode, obtained when the unload selector gates off all but one fanout of each chain to the XOR inputs of the unload compressor. In certain circumstances, observability can be higher in single-fanout XOR mode than in the multiple-fanout XOR mode obtained when the unload selector functions transparently (subsection B2.3); and higher observability can reduce pattern count and improve detection of unmodeled defects. The unload selector is controlled by U unload control signals obtained from the load decompressor, and by E unload enable primary inputs. The exact values of U and E define a range of architectures: In the simplest implementation U=0, i.e., the unload selector is controlled every cycle by E dedicated unload enable inputs; the E values for every shift cycle are calculated during ATPG and stored as part of regular scan-in data (see subsection B3). Because unload control data is not shared with load data, this implementation is termed "NON-SHARED". Based on the control inputs, the unload selector chooses between transparent (full XOR) mode or one of the direct observation modes.

Since at most Q chains can be observed in a direct observation mode, the minimal value for E is:

$$E = \left\lceil \log\left(1 + \left\lceil \frac{C}{Q} \right\rceil\right) \right\rceil$$

where the added 1 is for the transparent mode. For example, to achieve a compression of 10× (vs. scan), assuming there are 20% more compressed patterns than scan patterns, C=10*1.2*Q and E=4 unload inputs.

However, given a limited total input pin budget N+E, it is generally preferred to minimize E, so N can be maximized, thereby reducing care bit dependencies in the load compressor. Also, for cycles that do not require one of the direct observation modes, all inputs can then be dedicated to load care bits. The preferred implementation detailed in this paper uses E=1 unload enable inputs. In this case, the unload selector chooses one of the direct observation modes based on the U unload controls derived from the load decompressor, thus this implementation is termed "SHARED", and:

$$U = \left\lceil \log\left(\left\lceil \frac{C}{Q} \right\rceil\right) \right\rceil$$

The transparent mode is selected when the enable input is asserted, independent of the values on the U control signals. Note the potential conflicts on assigning values on the N scan input pins so that the care bits (load values) for pattern n+1 are satisfied simultaneously with the unload requirements on the U control signals for pattern n (subsection B3). Fortunately, most shift cycles use the unload selector in transparent mode, thus the U control signals can have any values and only the enable input must be asserted.

Finally, the architecture of FIG. 11 also supports optional pipelining of the N+E inputs and Q outputs (not shown), so that the delay of the combinational compressor/decompressor structures and added wires need not slow down the shifting speed. Pipestages, however, add additional complexity to overlapping a pattern load with the previous pattern unload (subsection B3).

Subsection B2.1 Unload Selector Implementation

The unload selector must be designed to operate with the unload compressor, so that each chain can be uniquely observed (i.e., with no XOR-ing) in at least one direct observation mode. Also, the number of direct observation modes should be minimized, therefore minimizing the number of unload control signals U+E.

The unload selector can be implemented with no more than two AND gates per internal chain (FIG. 12); for each chain, the first AND gates one of the paths from the chain output to an output pin, and the second AND gates the remaining fanout of the chain, if any (chains with single fanout need only a single AND). For example (FIG. 12), chain c1 connects, via the XOR unload compressor, to outputs out1, out2 and out3; a first AND on the output of chain c1 gates its connection to out1, and a second AND gates its connection to out2 and out3. Similarly, c2 connects to out1, out2 and out4, etc.

In transparent mode, all four signals from the "unload control logic" to the AND gates are 1, so AND gates are "on", passing through the unload values. In the selective (direct observation) mode shown, the four signals from the unload control logic are (top-down) {0, 0, 1, 0}, respectively, and only the two shaded AND gates are on. Therefore, chain c1 is uniquely connected to out1, and c2 to out2 (some other chains, not shown, uniquely connect to out3 and out4). In the mode shown, chain c13 is not observed at any output: both of its AND gates are off. Similarly, if the four signals from the unload control logic are {1, 0, 0, 0}, chain c13 is observed at out1, while c1 and c2 are not observed.

The unload control logic consists of a simple combinational decoder of its U+E inputs. The unload selector plus the unload control logic add about two 2-input gates to each scan chain, bringing the total area overhead, including load decompressor and unload compressor, to about 12 gates per chain, a small fraction of the total chip area. The unload selector is designed after the unload compressor has been designed for optimal observability in the presence of unknown values. It is important to first optimize the unload compressor because transparent mode is typically the preferred mode due to its higher observability than direct observation modes, as long as the Xs do not prevent detection of targeted faults. The unload selector is then designed based on the existing unload compressor, so that each chain can be uniquely observed in some mode, and the total number of direct observation modes is as small as possible.

For example, in the following Table 3, 10 chains (0, 1, . . . , 9) are connected to 4 outputs (0, 1, 2, 3) so that in transparent mode (mode 0) chains 0, 2, 5, 7 and 8 are XOR-ed to output 0, chains 0, 3, 6, 7 and 9 are XOR-ed to output 1, etc.

TABLE 3

Non-optimal unload selector

| output | mode 0 | mode 1 | mode 2 | mode 3 | mode 4 |
|--------|--------|--------|--------|--------|--------|
| 0 | 0 2 5 7 8 | 0 | 5 | 2 | |
| 1 | 0 3 6 7 9 | 6 | 3 | | |
| 2 | 0 4 6 8 9 | 4 | | | |
| 3 | 1 5 7 8 9 | 7 | 8 | 9 | 1 |

To exploit the minimal hardware implementation (FIG. 12), each direct observation mode (mode 1, 2, etc.) must select, for each output, one of the chains already connected to the output in mode 0. Ideally, each direct observation mode selects 4 unique chains so 10/4=2.5, i.e. 3 modes should suffice to observe all chains.

However, a careless assignment of chains to outputs for direct observation modes can result in more, e.g. 4 modes. Indeed (in table 3 below), let chains 0, 5 and 2 be selected in modes 1, 2 and 3, respectively, for output 0, and chains 7, 8 and 9 be selected in modes 1, 2 and 3, respectively, for output 3. Next, for output 1, chains 6 and 3 can be Selected for modes 1 and 2, but no new chain can be chosen for mode 2, because all other chains of output 1 (0, 7, 9) have already been assigned to some other output in some mode. Similarly, output 2 can only add chain 4. A fourth mode is needed to observe chain 1.

In some cases, the unload compressor may be such that C chains cannot be directly and uniquely observed at Q outputs in only modes; moreover, an algorithm that would guarantee the minimal number of modes for any unload compressor could be prohibitively slow. Instead, we devised a greedy heuristic that produced optimal results in all cases tried, with negligible run-time is shown below.

```
foreach direct-observation unload mode m
    repeat until all chains connected
        q=remaining output with fewest chains
        c=remaining chain with fewest outputs
        connect q to c in mode m
    end
end
```

For the previous example, the greedy heuristic shown above assigns first chains 2, 3, 4, 1 to outputs 0, 1, 2, 3 in mode 1 (Table 4); next, chains 5, 7, 6, 0 are assigned to outputs 0, 3, 1, 2 (in this order) in mode 2; finally, chains 8 and 9 are assigned to outputs 0 and 1 in mode 3. Only 3 modes suffice to directly observe all chains. If two signals are used to decode the 3 modes, the last, unused 4th mode can be configured as the single-fanout XOR mode (subsection B2.3).

Subsection B2.2. Shared Unload Control Implementation

Figure 12:
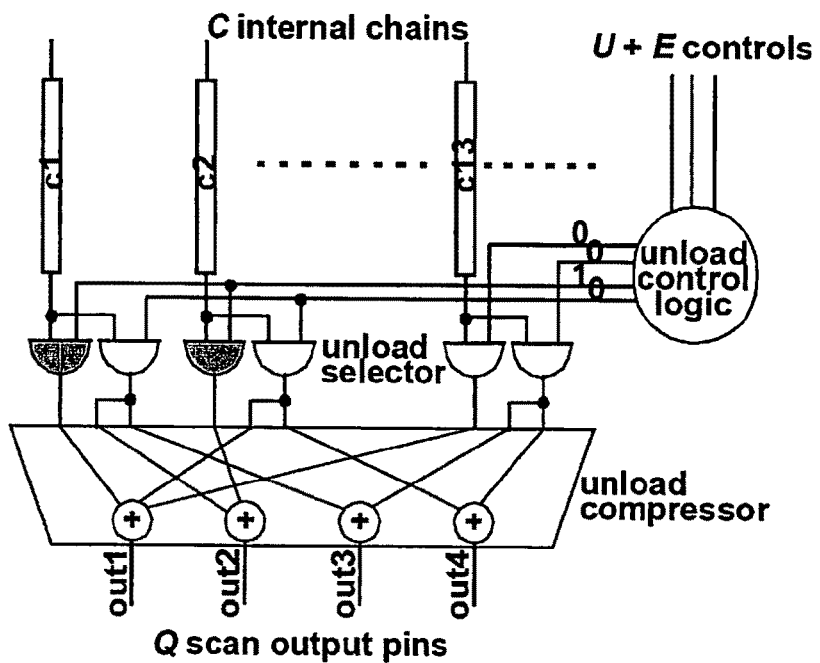
FIG. 12 illustrates an unload selector also as described in SECTION B below.

The unload selector is configured independently of the split between U and E (FIG. 11); the unload control logic decodes the U+E inputs into all required modes (FIG. 12). However, when using the shared configuration, the U signals from the load compressor must be independent. The load compressor is first designed for C scan chains, so that any two chains can load independent values in at least one mode. The requirements for the U unload controls are stricter: all U signals must be independent to allow selection of any unload mode; fortunately, U is typically much smaller than C (2).

Figure 13:
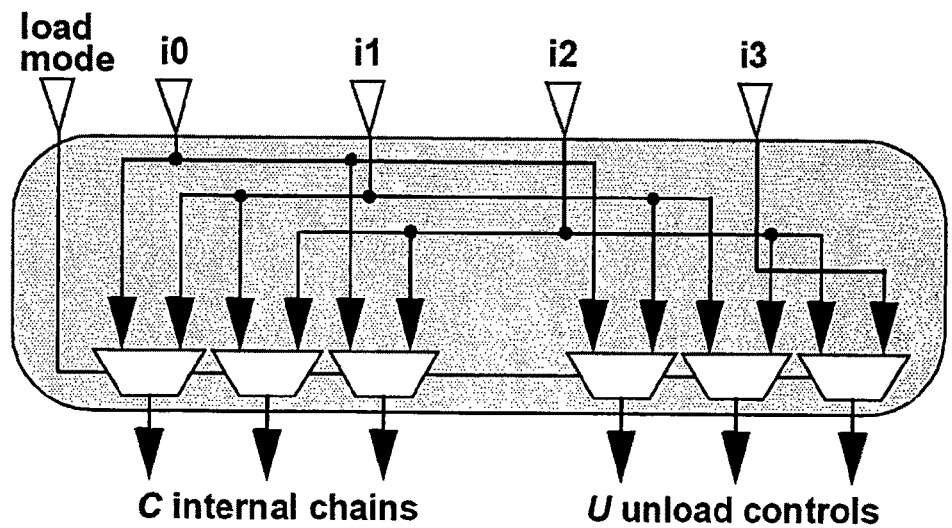
FIG. 13 illustrates an architecture of a decompressor, also as described in SECTION B below.

Further, to minimize the chance of conflict between load compressor inputs for satisfying care bits and for setting the U unload controls, there should be minimal overlap between load modes in how unload controls are assigned load compressor inputs. For example, (FIG. 13) the three internal chains receive inputs (i0, i1, i0) in load mode 0, and (i1, i2, i2) in load mode 1; any two chains can load independent values in at least one load mode, but not all three chains are independent: the values (0, 0, 1) cannot be loaded in either mode. By contrast, the three unload controls are independent in both modes: they receive inputs (i0, i1, i2) in load mode 0 and (i1, i2, i3) in load mode 1.

The METHOD devised for computing the unload controls is local-minimization heuristic as shown below; the cost function is computed based on how many times inputs and pairs of inputs are used. A cost table is kept, initialized to 0 for all inputs and input pairs, except for the diagonal entries which are initialized to a very large value to avoid choosing the same input twice. At each step, the row r is chosen that has the lowest sum over all pairs (r, n); in case of equal sums, the row with lower usage is chosen.

METHOD for Unload Control Generation (Local-Minimization Heuristic)

```
foreach load mode m
    foreach unload control signal u
        r=row with lowest sum & lowest usage
        connect u to input r in mode m
        foreach input pair used
            cost = 2*cost + 1
        end
    end
end
```

For example, (FIG. 14) U=3 unload controls are assigned inputs from 0 to 4 for three load modes. For load mode 0, unload controls (0, 1, 2) are assigned inputs (0, 1, 2) respectively. Next, for load mode 1, the algorithm continues to assign unused input pairs, so unload controls (0, 1, 2) are assigned inputs (3, 4, 0) respectively (FIG. 14, bottom). The cost table at this stage is shown on the upper left of FIG. 14: input 0 was used twice, all other inputs were used once; all input pairs were used once, except pairs (1, 3), (1, 4), (2, 3) and (2, 4) have not been used yet. Finally, for load mode 2, unload controls (0, 1, 2) are assigned inputs (1, 3, 2) respectively; the final cost table is shown on the upper right.

When computing unload controls (as per the Unload control generation METHOD shown above), it is desirable, but not required, that all unload modes be controllable in every load mode; for example, with 2 load modes and 4 load compressor scan inputs, 32 unload modes can be controlled, 16 in each load mode. In general, for N inputs (load mode controls+ load compressor scan inputs), $2^N$ unload modes can be controlled, so up to $Q2^N$ internal chains can be observed with 100% X-tolerance. Therefore, for an implementation with the same number of inputs and outputs N=Q−1, fully X-tolerant compression is limited by the ratio of internal to external chains $2^{Q-1}$.

Subsection B2.3. Single-fanout full-observability XOR mode

Unknown values render all outputs they propagate to unusable for the current cycle, thus may mask errors from being detected. Therefore, X-masking can reduce test coverage and, by reducing the number of faults detected per pattern, can increase pattern count. To guarantee detection of one error in the presence of two Xs, each chain must connect to at least 3 outputs so that any two chains share at most one output (FIG. 15).

However, increased chain fanout, while it can increase tolerance to one and two Xs per shift, can also decrease observability for more Xs, because each X masks out more outputs. For example, two simultaneous Xs can mask as many as 6 outputs, whereas in a compressor with chain fanout=1, two Xs can mask at most 2 outputs. Results of random simulation of compactors with chain fanout 1, 2 and 3 confirm this observation. For 192 chains and 16 outputs, compactors were generated with maximal X-tolerance for a given fanout, based on optimized algorithms. For 1, 2, 3, etc. randomly-placed Xs, the observability of the remaining, non-X chains was computed and averaged for 1000 trials. The results show that observability is highest for fanout=3 for up to 3 Xs per shift, then highest for fanout=2 for 4 to 7 Xs per shift; for 8 or more Xs, observability is highest for fanout=1. In fact, the single-fanout compactor still offers meaningful observability at higher densities of Xs, long after the multiple-fanout compactors have bottomed out at zero observability.

Even though direct-observation modes ensure detection of targeted faults no matter how many Xs are present, recent designs with high X densities can require so many shift cycles to use direct-observation modes that overall observability is low, increasing pattern count and lowering unmodeled defects detection. Therefore, the unload control logic (FIG. 12) can also provide a single-fanout, full-observability XOR mode. To avoid changes to the unload selector, the new mode implements an overlap (XOR) of all direct-observation modes, so no gates are added to the unload selector. The changes to the unload control logic are trivial, so the total area is not affected. In effect, all single-fanout (shaded) AND gates (FIG. 12) are on, while all other AND gates are off. The unload enable input selects between transparent and non-transparent modes; the latter can be either direct-observation modes, or the single-fanout XOR mode, as chosen by the unload controls.

Subsection B3—DRC & ATPG Enhancements

Design Rules Checking was enhanced with new rules that validate the X-masking logic in the design versus its description in the test protocol file. These can be grouped into: •Syntax checking for the new constructs. •Consistency checking of the structures as defined in the protocol file, and verification of the connectivity between ports and the compressor/decompressor logic, between the compressor/decompressor logic and the internal scan chains, and between the compressor/decompressor logic and the X-masking logic. •Data consistency checks to ensure that the X-masking logic does indeed provide 100% X-tolerance.

For enhanced performance, the ATPG process then uses the behavioral descriptions of the compressor/decompressor logic, derived from the protocol, rather than the gate-level netlist. The architecture described, although deceivingly simple, provides particular challenges for ATPG, as detailed in the rest of this section.

Figure 16:
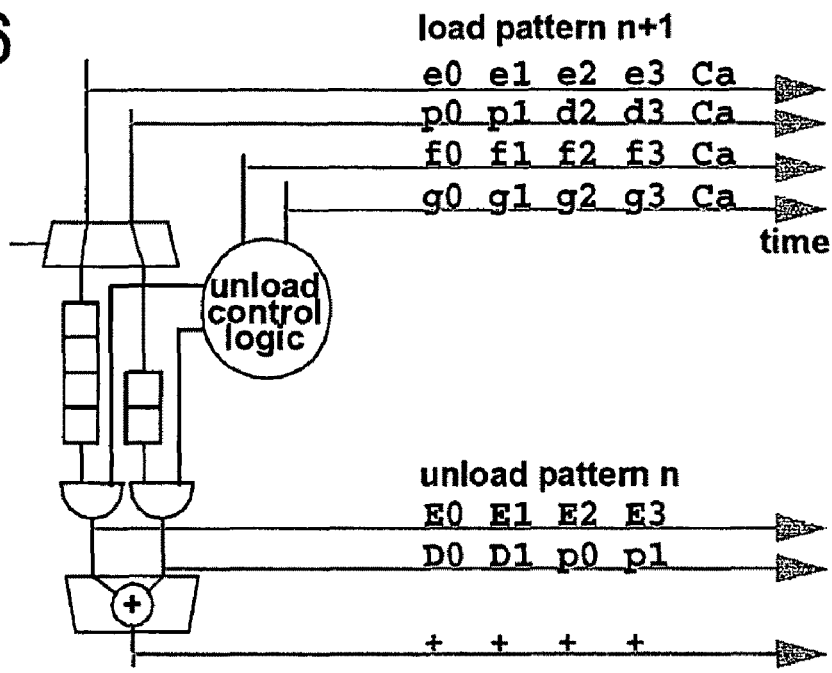
FIG. 16 illustrates, in a block diagram, various load and unload patterns, described in detail in SECTION B below.

In regular scan, each pattern can be independently computed; then, when writing out patterns in a tester-ready format, the load of pattern n+1 is simply overlapped with the unload of pattern n-no further pattern adjustment is needed. With compression (FIG. 1B), unload values of pattern n have a dependency on the overlapped load values of pattern n+1, due to short chains whose captured scan cell values cannot contribute to all the shifts. Consider two chains "e" and "d" of lengths 4 and 2, respectively (FIG. 16). The first unload values of pattern n is the XOR of the captured values E0 and D0, respectively. Similarly, the second shift cycle unloads the XOR of captured values E1 and D1. However, the third and fourth shift unload padding values p0 and p1 from the shorter "d" chain; these values have been shifted in during the overlapped load of pattern n+1, and are XORed with captured values E2 and E3. Therefore, to observe E2 and E3, it is necessary to consider the load values p0 and p1 of pattern n+1 when determining the unload values of pattern n. ATPG can still generate each pattern independently, but the final unload values observed at the output of the unload compressor cannot be computed until the next pattern has been created. Also, an additional pattern must be added to the end of the pattern set to define the load values being used for the last unload.

The unload selector (FIG. 11) adds an additional dependency between adjacent patterns: the values unloaded for pattern n depend on the inputs to the combinational unload control logic, f0, f1, . . . and g0, g1, . . . (FIG. 16) simultaneously loaded during pattern n+1. Further, in the shared architecture, f and g are part of the U unload controls obtained from the load decompressor, so a dependency exists between (e0, p0, f0, g0), between (e1, p1, f1, g1), (e2, d2, f2, g2) etc. ATPG must consider these dependencies, so patterns can no longer be computed independently. Paradoxically, pattern n cannot be completed until a future pattern, n+1, is computed.

Finally, if pipelining is added to the N scan inputs and/or Q scan outputs of FIG. 11, the dependencies between adjacent patterns shift accordingly, so the unload values of a pattern can depend on some load values of the next as well as some load values of the same pattern. ATPG must compute each pattern considering load-unload dependencies, as well as dependencies to future patterns.

An experimental analysis of load and unload dependencies is studied, where each data point is the average of 1000 random trials on a 200 chains design, with 16 total inputs. The non-shared X-tolerance architecture was configured with 3 load modes (2 load mode inputs), 10 scan inputs and 4 unload inputs—"load/load (not shared)"; the load decompressor ensures, by design, zero conflicts for up to two care bits, but conflict probability is higher than 0 for 3 or more care bits.

The shared X-tolerance architecture was also configured with 3 load modes (2 load mode inputs), but with 13 scan inputs and 1 unload enable input. By comparison, the "load/load (shared)" conflicts are significantly lower, due to the available extra 3 scan inputs. However, the shared architecture adds load/unload conflicts, i.e., the probability of not being able to set a desired direct-observation mode in a shift that already must satisfy a number of care bits. However, care bits are more often needed than nontransparent unload selector modes, so lowering load/load conflicts can be advantageous, even if load/unload conflicts are added. For optimal creation of patterns, the ATPG process must carefully consider these effects of X-tolerant operation.

Subsection B3.1. ATPG for shared architecture

For circuits with shared X-tolerance, the control of the X-tolerance selection is shared with the scan chain loading of the next pattern. This results in a complex dependency between adjacent patterns which cannot be ignored during test generation if direct-observation modes are to be used without the insertion of dummy patterns. Test generation first creates a pattern that is intended to detect a primary target fault. Before secondary target faults are considered, any care bits which can be used to provide needed direct-observation modes for faults detected in the previous pattern are set if possible. If the direct-observation mode needed for a targeted fault cannot be satisfied, an attempt is made to set one of the single-fanout XOR modes (subsection B2.3) if it results in fault detection. Secondary fault test generation is then performed to complete the pattern creation. After non-care bits have been filled in, good-machine simulation is performed on this pattern using the direct-observation modes created for the next pattern. For shifts with the observe selector in transparent mode, observability can be very low if multiple Xs are present (subsection B2.3); the enable input can be switched if the resulting mode (direct-observe or single-fanout XOR), based on the load values of the next pattern, results in higher observability. When simulating transparent mode shift cycles or cycles for which the unload controls (loaded in the next pattern) result in a single-fanout XOR mode, unload values can depend on load values of shorter chains (FIG. 16). If the next pattern is rejected for any reason (such as contention) or if the next pattern does not yet exist, then only transparent mode is enabled for the current pattern. Fault simulation is performed, and only gives detection credit for scan cells which are observable. Secondary target faults with an unobservable detection cell are retargeted for future patterns. There is some risk that primary target faults which require direct-observation modes will not be observable due to competition with care bits of the primary target fault of the next pattern. In this case, it is necessary to insert a dummy pattern to avoid test coverage loss. Since X-tolerance usage limits the ability to use scan cells in the next pattern, the number of merged secondary faults can be decreased, which can increase the total number of patterns.

Subsection B4—Low Overhead Scan Insertion Flow

Figure 17:
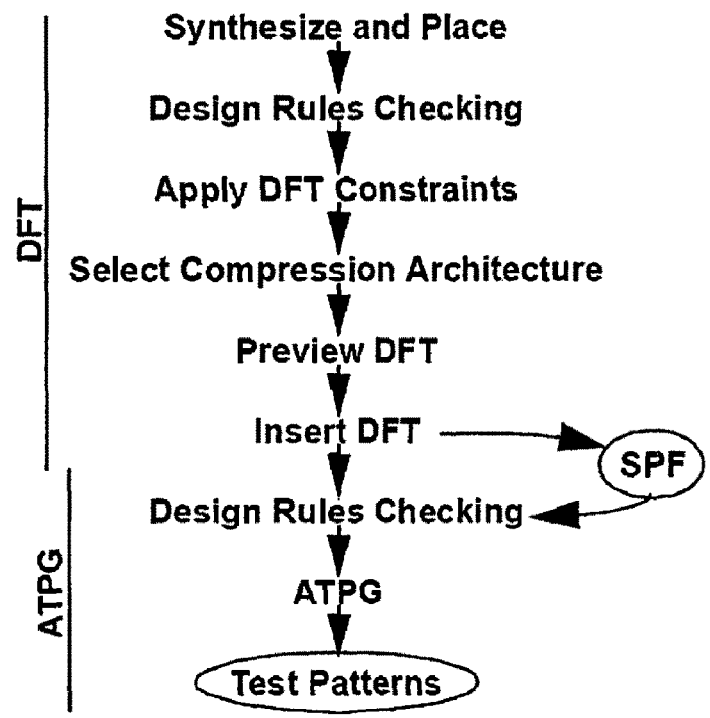
FIG. 17 illustrates, in a flow chart, steps performed in a scan DFT flow, also described in SECTION B below.

Our X-tolerant compression technique introduces only an incremental amount of combinational logic and, since it utilizes regular scan input/output terminals, there is no additional pin overhead on the input and output side of the decompressor and compressor respectively. The low overhead maintains the simplicity of a basic scan insertion process. The insertion flow (FIG. 17) is tightly integrated with proven scan insertion flows requiring very little additional user input. After synthesis, placement and successful RTL level DRC, the user can apply appropriate DFT constraints, such as the number of available scan input/output terminals. Also, the number of scan chains, the compression factor or scan length restrictions can be specified. Next, the compression architecture is selected, either with (FIG. 11) or without (FIG. 1B) the additional logic to provide 100% Xtolerance. The resulting DFT structures can be pre-viewed and adjusted before committing them to the design.

Architecting, logic insertion and protocol file creation are completely automated. The compressor/decompressor structures, as well as information required to interpret the Xmasking logic at the design interface, are described in the STIL protocol file (SPF). The user can optionally tune the compressor/decompressor parameters or custom-design blocks. The SPF file is regular enough so the user can create a functional description independent of the DFT process. Gate-level DRC is then performed on the DFT-inserted, gate-level netlist, followed by ATPG to create test patterns.

Figure 18:
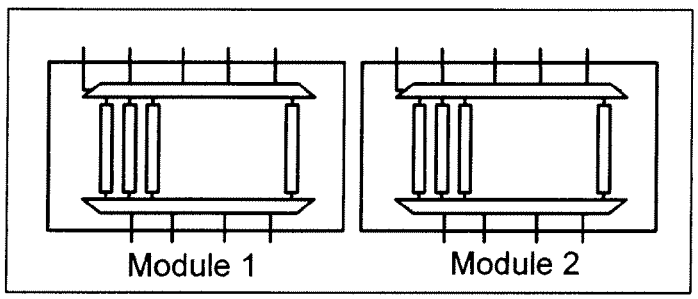
FIG. 18 illustrates a hierarchical architecture referenced in SECTION B below.
Figure 19:
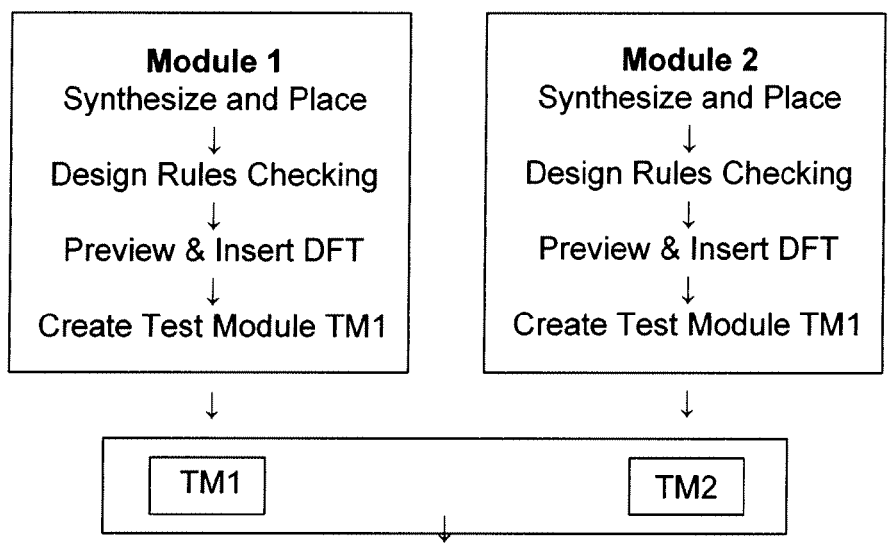
FIG. 19 illustrates, in a flow chart, steps performed in a hierarchical DFT flow, also described in SECTION B below.

In very large designs, it may not be possible to insert compression logic at the top level without introducing significant routing congestion due to the large number of scan paths. In such cases, a hierarchical approach (FIG. 19) can be adopted by partitioning the design into modules, inserting compression logic at the module-level and then integrating the blocks at the design-level (FIG. 18). The DFT logic in a sub-module can be abstracted in the form of a test model which can be used instead of the full netlist representation of the module during integration. In this case, the modulelevel DFT signals are automatically connected to designlevel ports and information about module-level compression logic is automatically promoted to the design-level protocol file. The module-level compressor/decompressor information for multiple modules will be captured in separate sections in a single design-level protocol file which can then be used for test pattern generation for the design. Module-specific protocol files can also be generated if desired.

Figure 20:
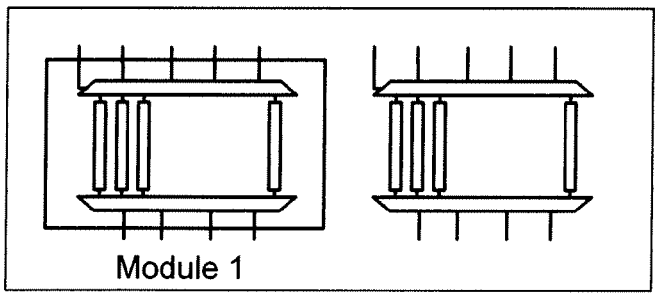
FIG. 20 illustrates a hybrid architecture referenced in SECTION B below.

A variant of the hierarchical flow, termed the hybrid flow, allows insertion of compression logic at the module level and then integrate the modules at the design level while simultaneously inserting compression logic for any top level scan chains (FIG. 20). As before, the user can opt to have the additional logic for 100% X-tolerance at the design or module level. Also, a single protocol file will be generated at the design level capturing details of compression logic at the top and module levels.

Subsection B5—Results

The shared compression architecture presented here was implemented in the integrated scan DFT-ATPG flow and applied to 19 industrial designs ranging from 0.5 million to 3.5 million gates, all of which had significant density of Xs. The compression target for these experiments was 10×, so the compressed designs were configured with 12× the number of internal scan chains vs. scan, to allow for a 20% pattern inflation over normal-scan. Data compression exceeded the 10×target for almost all designs for both stuck-at and transition faults. One particular design had slightly lower transition compression due to higher pattern inflation caused by very high X-density, which also caused the large coverage loss unless the fully Xtolerant architecture is used. Cycles compression exceeded the 10× target for all designs due to better balanced scan chain lengths in the compressed flow.

More importantly, results showed only small variations across designs, so the compression method achieves predictable results despite the varied density of Xs. For both stuck-at and transition, the compression ATPG run required, on average, less than twice the time of normal scan ATPG. The increase is due to additional computation necessary to compress load and unload data, additional test-generation activity searching for a load decompressor mode that satisfies all care bits and enables blockage of Xs in the unload selector, and to slower fault dropping due to X-masking, requiring more fault simulation. The total area overhead, including all compression/decompression logic and scan reconfiguration MUXes was only about 1%. Each design was run through the entire DFT scan-insertion flow twice—once with, and once without, compression. The difference in the number of gates was computed and divided by the number of internal chains. For designs smaller than 1 million gates, the total overhead was 1% or higher, whereas for larger designs it is only 0.5% or even lower.

Subsection B6—Conclusion:

We have presented a combinational, fully X-tolerant scan compression method that achieves the test coverage of uncompressed scan even in the presence of very high X-densities. This method is fully integrated in the scan synthesis and test generation flows and has minimal impact on area, timing, and design flow. We extended the previously introduced combinational load decompressor to provide unload controls to a new unload selector which, in conjunction with the unload compressor, ensures 100% X-tolerance. ATPG was enhanced to consider both load care bits and unload selector controls as part of the fault detection process. Predictable 10× data and test application time compressions were demonstrated on industrial designs, with acceptable ATPG time increase, and with no loss of test coverage. Ongoing work addresses higher compression rates for designs with very high X density and/or few pins.

What is claimed is:

1. An electronic device comprising:
a circuit comprising a combinational decompressor, a combinational compressor, a plurality of scan chains coupled between the combinational decompressor and the combinational compressor, each scan chain comprising a plurality of scan cells;
wherein the circuit further comprises logic to implement a plurality of features of functionality to be performed by the electronic device, the logic comprising a plurality of flip flops, and each scan cell comprising a multiplexer coupled to a flip flop in the plurality of flip flops; and
a pipeline consisting of at least one additional storage element coupled between one of: an input external interface of the electronic device and the combinational decompressor, and an output external interface of the electronic device and the combinational compressor, each additional storage element being configured to one of hold state, reset, and set during a capture cycle based on a scan enable signal, and each additional storage element being configured as a non-scan cell.

2. The electronic device of claim 1 wherein the additional storage element in the pipeline is coupled between the combinational decompressor and an input terminal in the external interface, wherein the external interface further comprises N input terminals other than the input terminal, wherein the pipeline further comprises N additional storage elements coupled between the combinational decompressor and the N input terminals in the external interface.

3. The electronic device of claim 1 wherein the additional storage element in the pipeline is coupled between the combinational decompressor and an input terminal in the external interface, the electronic device further comprising another pipeline, the another pipeline comprising another additional storage element coupled between the combinational compressor and an output terminal in the external interface.

4. The electronic device of claim 1 wherein the additional storage element in the pipeline is coupled between the combinational compressor and an output terminal in the external interface, wherein the external interface further comprises Q output terminals other than the output terminal, wherein the pipeline further comprises Q additional storage elements coupled between the combinational compressor and the Q output terminals in the external interface.

5. The electronic device of claim 1 wherein:
the additional storage element in the pipeline is coupled between the combinational decompressor and an input terminal in the external interface;
the external interface further comprises N input terminals other than the input terminal, and the pipeline further comprises N additional storage elements coupled between the combinational decompressor and the N input terminals in the external interface;
another pipeline comprising at least another additional storage element is coupled between the combinational compressor and an output terminal in the external interface; and
the external interface further comprises Q output terminals other than the output terminal, and the another pipeline further comprises Q additional storage elements coupled between the combinational compressor and the Q output terminals in the external interface.

6. The electronic device of claim 1 wherein the additional storage element is not used to implement the plurality of features of functionality to be performed by the electronic device.

7. The electronic device of claim 1 wherein:
the additional storage element is used to temporarily hold a signal received from the external interface, for transfer of said signal in a next cycle via a combinational decompressor to a first scan cell in a scan chain among the plurality of scan chains.

8. The electronic device of claim 1 wherein:
the additional storage element is directly connected to the external interface without any combinational element or storage element therebetween.

9. The electronic device of claim 1 wherein:
the additional storage element comprises a multiplexer coupled to the external interface;
the additional storage element further comprises a flip flop coupled to the multiplexer;
an input of the flip flop is coupled to an output of the multiplexer; and
an output of the flip flop is coupled to an input of the multiplexer.

10. The electronic device of claim 1 wherein:
the additional storage element is configured in a feedback loop to hold state in response to the scan enable signal being inactive during a capture cycle.

11. The electronic device of claim 1 wherein:
the additional storage element is configured to supply a predetermined value in response to the scan enable signal being inactive during a capture cycle.

12. A computer-readable medium storing computer-executable instructions for designing an electronic device, the electronic device comprising a combinational decompressor and a plurality of pipelines coupled between the combinational decompressor and an external interface of the electronic device, the computer-executable instructions when executed by a computer performing steps comprising:
performing for each input pin of the combinational decompressor:
identifying all stages in a pipeline located in a path between the input pin of the combinational decompressor and the external interface; and
recording a location of an output pin of the path and any inversion parity between the output pin of the path and the input pin; and
modifying verification of a load operation of the combinational decompressor by an automatic test pattern generation tool so that each load input is adjusted to be a calculated pipeline stage output with associated inversion parity.

13. The computer-implemented of claim 12 wherein:
a stage in the pipeline comprises a configuration of a feedback loop to hold state in response to a scan enable signal being inactive during a capture cycle; and
the modifying of verification of the unload operation is based on the configuration.

14. The computer-implemented of claim 12 wherein:
a stage in the pipeline comprises a predetermined configuration; and
the modifying of verification of the unload operation is based on the predetermined configuration.

15. A computer-readable medium storing computer-executable instructions for designing an electronic device, the electronic device comprising a circuit, the circuit comprising a combinational decompressor, a combinational compressor, a plurality of scan chains coupled between the combinational decompressor and the combinational compressor, the electronic device further comprising a plurality of pipelines coupled between the circuit and an external interface of the electronic device, the computer-executable instructions when executed by a computer performing steps comprising:
performing for each output pin of the combinational compressor:
identifying all stages in a first pipeline located between the output pin of the combinational compressor and the external interface by tracing based on a first plurality of precalculated shift simulation values from the output pin of the combinational compressor through a plurality of sensitized gates until a first path comprising a first pre-specified number of stages of the first pipeline is traced; and
recording a location of an input pin of the first path identified by the tracing from the output pin of the combinational compressor and any inversion parity between the input pin of the first path and the output pin of the combinational compressor;
performing for each input pin of the combinational decompressor:
identifying all stages in a second pipeline located between the input pin of the combinational decompressor and the external interface by tracing based on a second plurality of precalculated shift simulation values from the input pin of the combinational decompressor through a plurality of sensitized gates until a second path comprising a second pre-specified number of stages of the second pipeline is traced; and
recording a location of an output pin of the second path identified by the tracing from the input pin of the combinational decompressor and any inversion parity between the output pin of the second path and the input pin of the combinational decompressor;
modifying verification of an unload operation of the combinational compressor and verification of scan chain operation by an automatic test pattern generation tool so that each unload output is adjusted to be a calculated pipeline stage input with associated inversion parity; and
modifying verification of a load operation of the combinational decompressor and verification of scan chain operation by the automatic test pattern generation tool so that each load input is adjusted to be a calculated pipeline stage output with associated inversion parity.

* * * * *

UNITED STATES PATENT AND TRADEMARK OFFICE
CERTIFICATE OF CORRECTION

PATENT NO. : 7,823,034 B2
APPLICATION NO. : 11/786968
DATED : October 26, 2010
INVENTOR(S) : Peter Wohl et al.

Page 1 of 1

It is certified that error appears in the above-identified patent and that said Letters Patent is hereby corrected as shown below:

On the title page item (56), References Cited OTHER PUBLICATIONS; insert

-- Hamzaoglu et al. "Reducing Test Application Time for Full Scan Embedded Cores", Digest of Papers, 29$^{th}$ Annual International Symposium on Fault-Tolerant Computing, 1999, pp. 260-267 --.

Signed and Sealed this
Seventeenth Day of May, 2011

David J. Kappos
*Director of the United States Patent and Trademark Office*